United States Patent
Utsumi et al.

(10) Patent No.: US 10,930,741 B2
(45) Date of Patent: Feb. 23, 2021

(54) SILICON CARBIDE SEMICONDUCTOR DEVICE AND METHOD OF MANUFACTURING A SILICON CARBIDE SEMICONDUCTOR DEVICE

(71) Applicant: FUJI ELECTRIC CO., LTD., Kawasaki (JP)

(72) Inventors: Makoto Utsumi, Matsumoto (JP); Tsuyoshi Araoka, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/660,129

(22) Filed: Oct. 22, 2019

(65) Prior Publication Data

US 2020/0212183 A1 Jul. 2, 2020

(30) Foreign Application Priority Data

Dec. 27, 2018 (JP) .............................. JP2018-244471

(51) Int. Cl.

| | |
|---|---|
| *H01L 29/10* | (2006.01) |
| *H01L 29/16* | (2006.01) |
| *H01L 29/423* | (2006.01) |
| *H01L 21/04* | (2006.01) |
| *H01L 29/66* | (2006.01) |
| *H01L 21/02* | (2006.01) |

(52) U.S. Cl.
CPC .... *H01L 29/1608* (2013.01); *H01L 21/02529* (2013.01); *H01L 21/0455* (2013.01); *H01L 21/0465* (2013.01); *H01L 29/4236* (2013.01); *H01L 29/66734* (2013.01)

(58) Field of Classification Search
CPC ............. H01L 29/1608; H01L 21/0465; H01L 29/4236; H01L 21/0455; H01L 29/66734; H01L 21/02529; H01L 29/1095
See application file for complete search history.

(56) References Cited

U.S. PATENT DOCUMENTS

| | | | | |
|---|---|---|---|---|
| 5,689,128 | A | * 11/1997 | Hshieh ................. | H01L 29/0878 257/331 |
| 7,825,449 | B2 | * 11/2010 | Suzuki .............. | H01L 29/66068 257/301 |

(Continued)

FOREIGN PATENT DOCUMENTS

| | | |
|---|---|---|
| JP | 2007281265 A | 10/2007 |
| JP | 2017168665 A | 9/2017 |

*Primary Examiner* — Bitew A Dinke
(74) *Attorney, Agent, or Firm* — Rabin & Berdo, P.C.

(57) ABSTRACT

A p-type base region is configured by a $p^-$-type channel region and a p-type high-impurity-concentration region adjacent to the channel region in a horizontal direction. A point having a highest impurity concentration in the high-concentration region is located at a position separated from a lower surface of an $n^{++}$-type source region. The impurity concentration in the high-impurity-concentration region decreases toward the front surface of the semiconductor substrate and the rear surface of the semiconductor substrate in the depth direction. The impurity concentration in the high-impurity-concentration region decreases toward the low-impurity-concentration region in a direction parallel to the front surface of the semiconductor substrate.

6 Claims, 11 Drawing Sheets

(56) References Cited

U.S. PATENT DOCUMENTS

| | | | |
|---|---|---|---|
| 10,008,592 B1* | 6/2018 | Kojima | H01L 29/7811 |
| 2007/0114599 A1* | 5/2007 | Hshieh | H01L 29/7813 |
| | | | 257/330 |
| 2009/0146209 A1* | 6/2009 | Akiyama | H01L 29/1095 |
| | | | 257/334 |
| 2012/0261714 A1* | 10/2012 | Taketani | H01L 29/1095 |
| | | | 257/139 |
| 2014/0339569 A1* | 11/2014 | Sugimoto | H01L 29/0878 |
| | | | 257/77 |
| 2015/0236119 A1* | 8/2015 | Tanaka | H01L 21/26586 |
| | | | 257/77 |
| 2016/0099316 A1* | 4/2016 | Arai | H01L 29/1608 |
| | | | 257/77 |
| 2016/0247910 A1* | 8/2016 | Suzuki | H01L 29/0623 |
| 2017/0141223 A1* | 5/2017 | Hoshi | H01L 29/7813 |
| 2017/0221714 A1* | 8/2017 | Wakimoto | H01L 29/4236 |
| 2017/0222046 A1* | 8/2017 | Wakimoto | H01L 29/7813 |
| 2017/0263757 A1* | 9/2017 | Saikaku | H01L 29/0878 |
| 2017/0271437 A1 | 9/2017 | Kono et al. | |
| 2018/0033876 A1* | 2/2018 | Sugahara | H01L 29/1608 |
| 2018/0033885 A1* | 2/2018 | Okumura | H01L 21/02529 |
| 2018/0040687 A1* | 2/2018 | Araoka | H01L 29/1608 |
| 2018/0040698 A1* | 2/2018 | Kobayashi | H01L 29/7813 |
| 2018/0097069 A1* | 4/2018 | Utsumi | H01L 29/1095 |
| 2018/0097079 A1* | 4/2018 | Utsumi | H01L 29/4236 |
| 2018/0097093 A1* | 4/2018 | Pfirsch | H01L 29/0696 |
| 2018/0138264 A1* | 5/2018 | Kinoshita | H01L 29/063 |
| 2018/0138271 A1* | 5/2018 | Ohse | H01L 21/26513 |
| 2018/0138274 A1* | 5/2018 | Ohse | H01L 29/1095 |
| 2018/0138288 A1* | 5/2018 | Utsumi | H01L 29/1608 |
| 2018/0182885 A1* | 6/2018 | Kobayashi | H01L 29/0696 |
| 2018/0197947 A1* | 7/2018 | Iwaya | H01L 29/1608 |
| 2018/0197983 A1* | 7/2018 | Kinoshita | H01L 21/049 |
| 2018/0294350 A1* | 10/2018 | Utsumi | H01L 29/0623 |
| 2018/0301536 A1* | 10/2018 | Utsumi | H01L 29/51 |
| 2018/0358444 A1* | 12/2018 | Ryo | H01L 29/32 |
| 2018/0366574 A1* | 12/2018 | Ohse | H01L 29/66068 |
| 2019/0280118 A1* | 9/2019 | Kobayashi | H01L 29/8083 |
| 2019/0363166 A1* | 11/2019 | Knoll | H01L 29/7813 |

* cited by examiner

SILICON CARBIDE SEMICONDUCTOR DEVICE AND METHOD OF MANUFACTURING A SILICON CARBIDE SEMICONDUCTOR DEVICE

CROSS REFERENCE TO RELATED APPLICATIONS

This application is based upon and claims the benefit of priority of the prior Japanese Patent Application No. 2018-244471, filed on Dec. 27, 2018, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) has a larger bandgap than that of silicon (Si) and as a consequence has a greater critical field strength than that of silicon and therefore, is expected to be a semiconductor material capable of sufficiently reducing ON resistance. Further, in a semiconductor device (hereinafter, silicon carbide semiconductor device) in which silicon carbide is used as a semiconductor material, reduced ON resistance is demanded and in vertical metal oxide semiconductor field effect transistors (MOSFETs), a trench gate structure is employed that easily obtains low ON resistance characteristics structurally.

A trench gate structure is a MOS gate structure in which a MOS gate is embedded in a trench formed at a front surface of a semiconductor substrate. In a trench gate structure, a channel (n-type inversion layer) is formed in a vertical direction (depth direction) at a portion of a p-type base region along a trench side wall. While reducing a thickness of the p-type base region shortens channel length and thereby, enables reduced ON resistance by channel shortening, short channel effects increase, causing new problems to arise. Therefore, a structure to improve problems occurring due to increases in short channel effects has been proposed (for example, refer to Japanese Laid-Open Patent Publication No. 2017-168665).

In Japanese Laid-Open Patent Publication No. 2017-168665, a structure is disclosed in which a $p^+$-type region having an impurity concentration higher than that of the p-type base region is provided directly beneath an $n^{++}$-type source region, separated from the trench side wall by a predetermined distance and adjacent to a portion of the p-type base region forming the channel. The $p^+$-type region is a so-called HALO region and suppresses depletion layers that in the p-type base region, respectively spread from a pn junction between the p-type base region and the $n^{++}$-type source region and a pn junction between the p-type base region and an n-type current spreading region. The HALO region is formed by ion implantation (hereinafter, oblique ion implantation) of a p-type impurity from a direction that is oblique with respect to a side wall of a trench.

A conventional silicon carbide semiconductor device that does not include a HALO region is depicted in FIG. 13. FIG. 13 is a cross-sectional view of a structure of the conventional silicon carbide semiconductor device. A conventional silicon carbide semiconductor device 110 depicted in FIG. 13 is a vertical MOSFET that does not include a HALO region. A semiconductor substrate 130 is a silicon carbide epitaxial substrate in which silicon carbide epitaxial layers 131, 132 forming an $n^-$-type drift region 101 and a p-type base region 102 are sequentially deposited on an $n^+$-type starting substrate (not depicted) containing silicon carbide. A thickness t101 of the p-type silicon carbide epitaxial layer 132 is reduced, whereby a channel length L is shortened, enabling channel shortening.

In the semiconductor substrate 130, first and second $p^+$-type regions 121, 122 are selectively provided at positions that from a front surface of the semiconductor substrate 130, are deeper toward a drain than is a bottom of a trench 106. The first $p^+$-type region 121 faces the bottom of the trench 106. The second $p^+$-type region 122 is selectively provided between (mesa region) adjacent trenches 106, and separated from the trenches 106. The first and the second $p^+$-type regions 121, 122 are provided, whereby suppression of electric field applied to a gate insulating film in an OFF state and breakdown voltage enhancement are realized. Reference numerals 111, 112, 113 are metal films configuring a source electrode.

A method of manufacturing the conventional silicon carbide semiconductor device 110 depicted in FIG. 13 will be described. FIG. 14 is a flowchart of an outline of a method of manufacturing the conventional silicon carbide semiconductor device. An $n^-$-type silicon carbide epitaxial layer 131 is deposited on an $n^+$-type starting substrate containing silicon carbide. Ion implantation is performed repeatedly under differing conditions, respectively forming selectively in the $n^-$-type silicon carbide epitaxial layer 131, an n-type current spreading region 103 and the first and the second $p^+$-type regions 121, 122. A portion of the $n^-$-type silicon carbide epitaxial layer 131 excluding the n-type current spreading region 103 and the first and the second $p^+$-type regions 121, 122 becomes the $n^-$-type drift region 101.

Next, the p-type silicon carbide epitaxial layer 132 is deposited on the type silicon carbide epitaxial layer 131 (step S101). Next, in the p-type silicon carbide epitaxial layer 132, ion implantation (hereinafter, channel ion implantation) of an n-type impurity or a p-type impurity for gate threshold voltage control is performed (step S102). Next, an outer peripheral portion of the p-type silicon carbide epitaxial layer 132 is removed, leaving the p-type silicon carbide epitaxial layer 132 in a plateau (mesa) shape in an active region (step S103). Next, in the p-type silicon carbide epitaxial layer 132, ion implantation for forming the $n^{++}$-type source region 104 is performed (step S104).

Next, in the p-type silicon carbide epitaxial layer 132, ion implantation for forming a $p^{++}$-type contact region 105 is performed (step S105). In a process at step S105, by ion implantation of multiple steps (here, 3 steps) at differing acceleration energies, the $p^{++}$-type contact region 105 having a box profile is formed. Conditions of this 3-step ion implantation are monovalent aluminum ($Al^+$) as a dopant and respective acceleration energies of 160 keV, 90 keV, and 40 keV. A portion of the p-type silicon carbide epitaxial layer 132 excluding the $n^{++}$-type source region 104 and the $p^{++}$-type contact region 105 becomes the p-type base region 102.

Next, a predetermined edge termination structure is formed in an edge termination region that surrounds a periphery of the active region (step S106). Next, a heat treatment for activating all impurities ion implanted in the semiconductor substrate 130 is performed (step S107). Next, the trench 106 having a predetermined depth from the front surface of the semiconductor substrate 130 is formed (step S108). Next, a gate electrode 108 is formed in the trench 106, via a gate insulating film 107 (step S109). Thereafter, at both surfaces of the semiconductor substrate 130, a source electrode and a drain electrode (not depicted) are formed respectively as surface electrodes (step S110), whereby the MOSFET depicted in FIG. 13 is completed.

Next, a method of manufacturing a conventional silicon carbide semiconductor device including a HALO region will be described. FIG. 15 is a flowchart of an outline of another example of a method of manufacturing the conventional silicon carbide semiconductor device. The method of manufacturing a conventional silicon carbide semiconductor device in FIG. 15 differs from the method of manufacturing the conventional silicon carbide semiconductor device 110 in FIG. 14 in that after formation of the trench (step S117) and before formation of the gate electrode (step S120), a HALO region is formed by oblique ion implantation to the trench side wall (step S118). The heat treatment for impurity activation (step S119) is performed after formation of the HALO region.

Acceleration energy of the oblique ion implantation at step S118 is controlled, whereby at a portion separated from the trench side wall by a predetermined distance, the HALO region is formed and a p-type impurity concentration of a portion of the p-type base region along the side wall of the trench may be made relatively low. The portion of the p-type base region along the side wall of the trench is a portion where a channel is formed. Steps S111 to S117, S119 to S121 of the method of manufacturing the conventional silicon carbide semiconductor device in FIG. 15 are respectively similar to steps S101 to S106, S108, S107, S109, S110 of the method of manufacturing the conventional silicon carbide semiconductor device 110 in FIG. 14.

As a method of relatively reducing an impurity concentration of the portion where the channel is formed in the p-type base region, the following method has been proposed. A p-type impurity is ion implanted in an n$^-$-type drift region, forming a p$^+$-type region that becomes a p-type base region. Here, the p-type impurity diffuses out from inside the p$^+$-type region, whereby a portion adjacent to the p$^+$-type region is inverted to a p-type, thereby forming a p-type region (for example, refer to Japanese Laid-Open Patent Publication No. 2007-281265). In Japanese Laid-Open Patent Publication No. 2007-281265, the portion that is inverted to a p-type and becomes a p-type region is formed in a portion along the trench side wall of the p-type base region, whereby an impurity concentration of a portion of the p-type base region where a channel is formed, is reduced relatively.

SUMMARY OF THE INVENTION

According to an embodiment of the invention, a silicon carbide semiconductor device includes a semiconductor substrate containing silicon carbide, having a front surface and a rear surface opposite to the front surface, the semiconductor substrate including a first semiconductor layer of a first conductivity type, and having an upper surface and a lower surface, and a second semiconductor layer provided on the upper surface of the first semiconductor layer, and having an upper surface forming the front surface of the semiconductor substrate, and a lower surface facing the upper surface of the first semiconductor layer, a first semiconductor region of the first conductivity type selectively provided at the upper surface of the second semiconductor layer, a second semiconductor region of a second conductivity type selectively provided at the upper surface of the second semiconductor layer, a third semiconductor region of the second conductivity type and having an impurity concentration lower than an impurity concentration of the second semiconductor region, the third semiconductor region being a portion of the second semiconductor layer excluding the first semiconductor region and the second semiconductor region, the third semiconductor region including a high-impurity-concentration region of the second conductivity type and facing the second semiconductor region in a depth direction, and a low-impurity-concentration region of the second conductivity type and facing the high-impurity-concentration region in a direction parallel to the front surface of the semiconductor substrate, the low-impurity-concentration region having an upper surface facing the first semiconductor region and a lower surface facing the upper surface of the first semiconductor layer in the depth direction, the low-impurity-concentration region being a portion of the third semiconductor region excluding the high-impurity-concentration region, a trench penetrating the first semiconductor region and the low-impurity-concentration region from the front surface of the semiconductor substrate and reaching the first semiconductor layer, a gate insulating film provided on an inner surface of the trench, a gate electrode provided in the trench, via the gate insulating film, a first electrode electrically connected to the first semiconductor region and the second semiconductor region, and a second electrode provided at the rear surface of the semiconductor substrate. The impurity concentration in the high-impurity-concentration region decreases toward the low-impurity-concentration region in a direction parallel to the front surface of the semiconductor substrate.

In the embodiment, a width of the high-impurity-concentration region in the direction parallel to the front surface of the semiconductor substrate is greater than a width of the second semiconductor region.

In the embodiment, the high-impurity-concentration region has a one part that faces the first semiconductor region and an other part that faces the second semiconductor region in the depth direction, the impurity concentration in the high-impurity-concentration region decreases toward the front surface of the semiconductor substrate in the depth direction, and decreases toward the rear surface of the semiconductor substrate in the depth direction, and the first semiconductor region has an upper surface forming the front surface of the semiconductor substrate and a lower surface facing the high-impurity-concentration region, and a point of the high-impurity-concentration region having a greatest impurity concentration is located at a position separated from the lower surface of first semiconductor region in the depth direction.

In the embodiment, a distance between the high-impurity-concentration region and an outer surface of the trench in the direction parallel to the front surface of the semiconductor substrate is in a range of 0.04 μm to 0.2 μm.

In the embodiment, the distance between the high-impurity-concentration region and the outer surface of the trench is in a range of 0.06 μm to 0.1 μm.

According to another embodiment, a method of manufacturing a silicon carbide semiconductor device includes a first process of depositing a first semiconductor layer of a first conductivity type and containing silicon carbide on an upper surface of a starting substrate (base substrate) of the first conductivity type and containing silicon carbide, the first semiconductor layer having an impurity concentration lower than an impurity concentration of the starting substrate, a second process of depositing on a surface of the first semiconductor layer, a second semiconductor layer of a second conductivity type and containing silicon carbide, the second semiconductor layer having an upper surface, a third process of selectively forming at the upper surface of the second semiconductor layer, a first semiconductor region of the first conductivity type, a fourth process of forming at the upper surface of the second semiconductor layer, an ion implantation mask having an opening at a predetermined position, a fifth process of performing a first ion implantation of a second-conductivity-type impurity using the ion implantation mask to form at the upper surface of the second semiconductor layer, a second semiconductor region of the second conductivity type, having an impurity concentration higher than an impurity concentration of the second semiconductor layer, a sixth process of forming a third semiconductor region of the second conductivity type and having an impurity concentration lower than an impurity concentration of the second semiconductor region, the third semiconductor region being a portion of the second semiconductor layer excluding the first semiconductor region and the second semiconductor region, wherein the sixth process includes performing with an acceleration energy higher than an acceleration energy of the first ion implantation, a second ion implantation of the second-conductivity-type impurity using the ion implantation mask, to form in the second semiconductor layer, closer to a rear surface of the starting substrate than is the second semiconductor region, a high-impurity-concentration region of the second conductivity type and having an impurity concentration higher than the impurity concentration of the second semiconductor layer and lower than the impurity concentration of the second semiconductor region, and leaving a portion of the third semiconductor region excluding the high-impurity-concentration region, as a low-impurity-concentration region of the second conductivity type facing the high-impurity-concentration region in a direction parallel to the upper surface of the second semiconductor layer, a seventh process of forming a trench that penetrates the first semiconductor region and the low-impurity-concentration region from an upper surface of the second semiconductor layer and reaches the first semiconductor layer, an eighth process of forming a gate insulating film on an inner surface of the trench and a gate electrode in the trench, via the gate insulating film, a ninth process of forming a first electrode electrically connected to the first semiconductor region and the second semiconductor region, and a tenth process of forming a second electrode at the rear surface of the starting substrate.

In the embodiment, the fifth process and the sixth process are performed in succession.

In the embodiment, in the sixth process, a range of the second ion implantation is set deeper in a depth direction than an upper surface of the first semiconductor region. The method may further include after the fifth process and before the sixth process, widening a size of the opening of the ion implantation mask in the direction parallel to the upper surface of the second semiconductor layer.

In the embodiment, in the sixth process, a distance between the high-impurity-concentration region and an outer surface of the trench in the direction parallel to the front surface of the semiconductor substrate is in a range of 0.04 μm to 0.2 μm.

In the embodiment, the distance between the high-impurity-concentration region and the outer surface of the trench is in a range of 0.06 μm to 0.1 μm.

In the embodiment, in sixth process, the second-conductivity-type impurity implanted by the second ion implantation diffuses in the second semiconductor layer, and the impurity concentration in the high-impurity-concentration region decreases toward the low-impurity-concentration region in the direction parallel to the upper surface of the second semiconductor layer.

In the embodiment, in the sixth process, the second-conductivity-type impurity implanted by the second ion implantation diffuses, and a width of the high-impurity-concentration region becomes greater than a width of the opening of the ion implantation mask in the direction parallel to the upper surface of the second semiconductor layer.

According to another embodiment of the invention, a silicon carbide semiconductor device includes a semiconductor substrate containing silicon carbide, and having a front surface and a rear surface opposite to the front surface, the semiconductor substrate including a first semiconductor layer of a first conductivity type, having an upper surface and a lower surface, and a second semiconductor layer provided on the upper surface of the first semiconductor layer, and having an upper surface forming the front surface of the semiconductor substrate, and a lower surface facing the upper surface of the first semiconductor layer; the silicon carbide device further including a first semiconductor region of the first conductivity type, selectively provided at the upper surface of the second semiconductor layer; a second semiconductor region of a second conductivity type, selectively provided at the upper surface of the second semiconductor layer; a third semiconductor region of the second conductivity type, having an impurity concentration lower than an impurity concentration of the second semiconductor region, the third semiconductor region being a portion of the second semiconductor layer excluding the first semiconductor region and the second semiconductor region, the third semiconductor region including a high-impurity-concentration region of the second conductivity type, facing the second semiconductor region in a depth direction, and at least one low-impurity-concentration region of the second conductivity type, facing the high-impurity-concentration region in a direction parallel to the front surface of the semiconductor substrate, the at least one low-impurity-concentration region having an upper surface facing the first semiconductor region and a lower surface facing the upper surface of the first semiconductor layer in the depth direction, the at least one low-impurity-concentration region being a portion of the third semiconductor region excluding the high-impurity-concentration region; the silicon carbide device further including a trench penetrating the first semiconductor region and the at least one low-impurity-concentration region from the front surface of the semiconductor substrate, and reaching the first semiconductor layer; a gate insulating film provided on an inner surface of the trench; a gate electrode provided in the trench, via the gate insulating film; a first electrode electrically connected to the first semiconductor region and the second semiconductor region; and a second electrode provided at the rear surface of the semiconductor substrate. The impurity concentration in the high-impurity-concentration region decreases toward a closest one of the at least one low-impurity-concentration region in a direction parallel to the front surface of the semiconductor substrate.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques will be described. As described above, a HALO region is provided in a MOSFET, whereby even when channel length is shortened to reduce ON resistance, increases in short channel effects (effects occurring due to depletion layers that respectively spread in the p-type base region from a source side and a drain side) when the MOSFET is ON may be suppressed and decreases in gate threshold voltage may be suppressed. Therefore, low ON resistance and high gate threshold voltage may both be achieved.

Nonetheless, when the HALO region is formed by oblique ion implantation to the trench side wall, variation in formation positions of the HALO region easily occur, and characteristics of unit cells formed at a surface of one semiconductor wafer may vary. Main causes of variation in formation positions of the HALO region include trench dimensions, angle of the trench side wall, position of ion implantation source from the trench side wall, and position of unit cells (functional units of element) at the semiconductor wafer surface.

Figure 14:
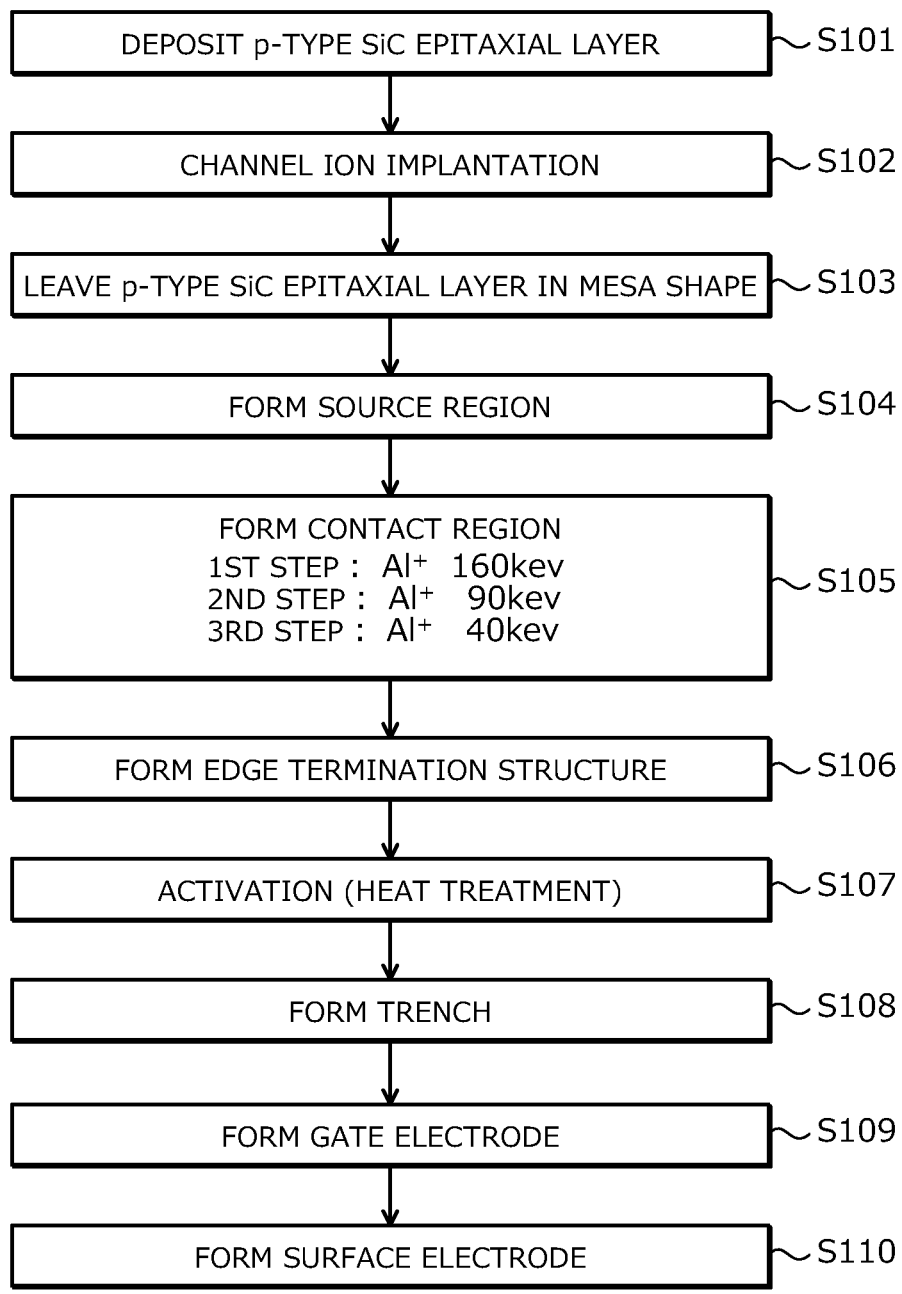
FIG. 14 is a flowchart of an outline of a method of manufacturing the conventional silicon carbide semiconductor device.
Figure 15:
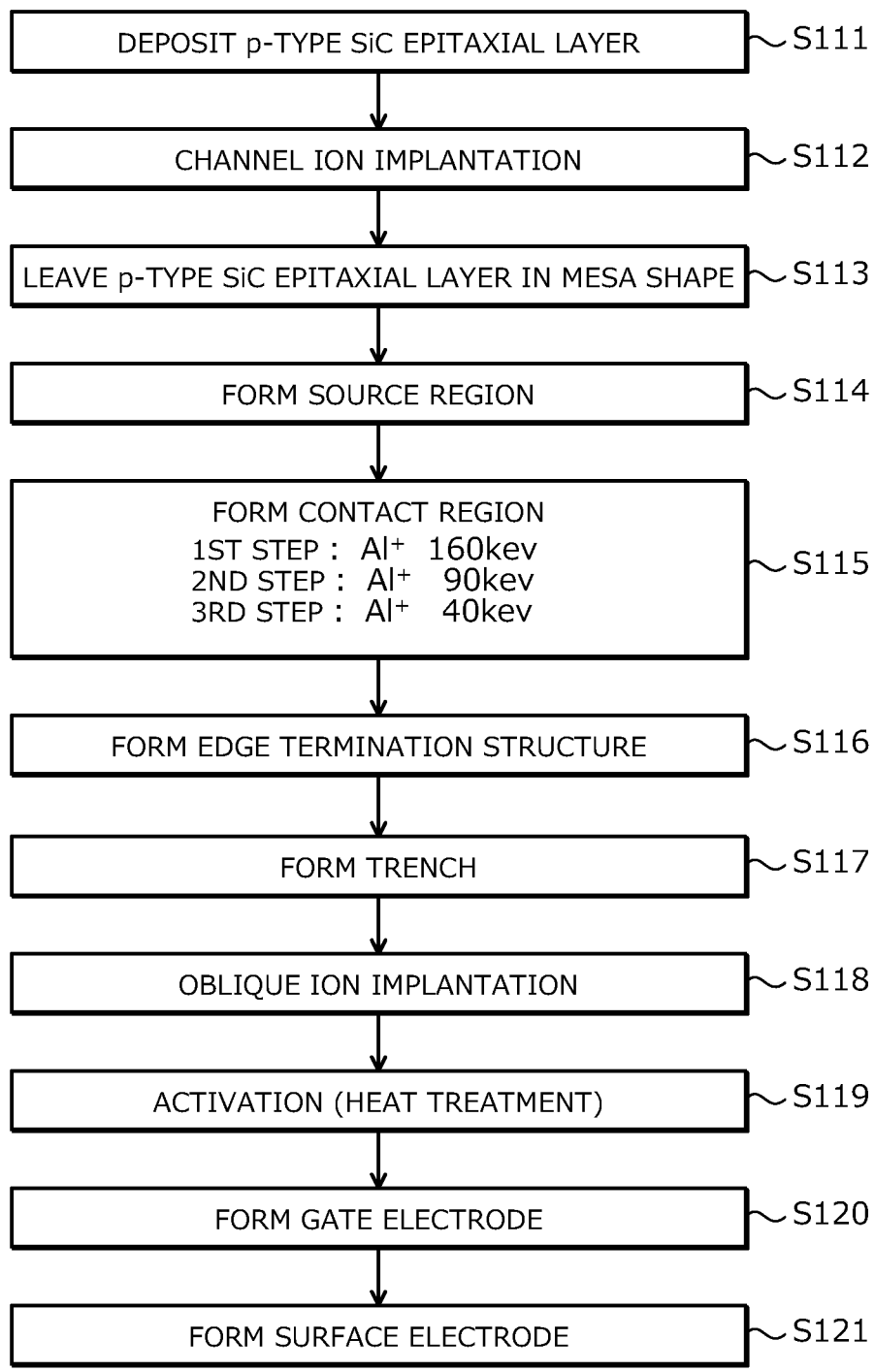
FIG. 15 is a flowchart of an outline of another example of a method of manufacturing a conventional silicon carbide semiconductor device.

Further, when the HALO region is formed by oblique ion implantation to the trench side wall (refer to FIG. 15), a process sequence is changed from the method of manufacturing the conventional silicon carbide semiconductor device 110 that does not include the HALO region (refer to FIG. 14) and therefore, production control becomes complicated due to design modifications of the production line. Further, the oblique ion implantation (step S118 in FIG. 15) has to be performed in both side walls of the trench and therefore, process lead time for forming the HALO region becomes longer.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
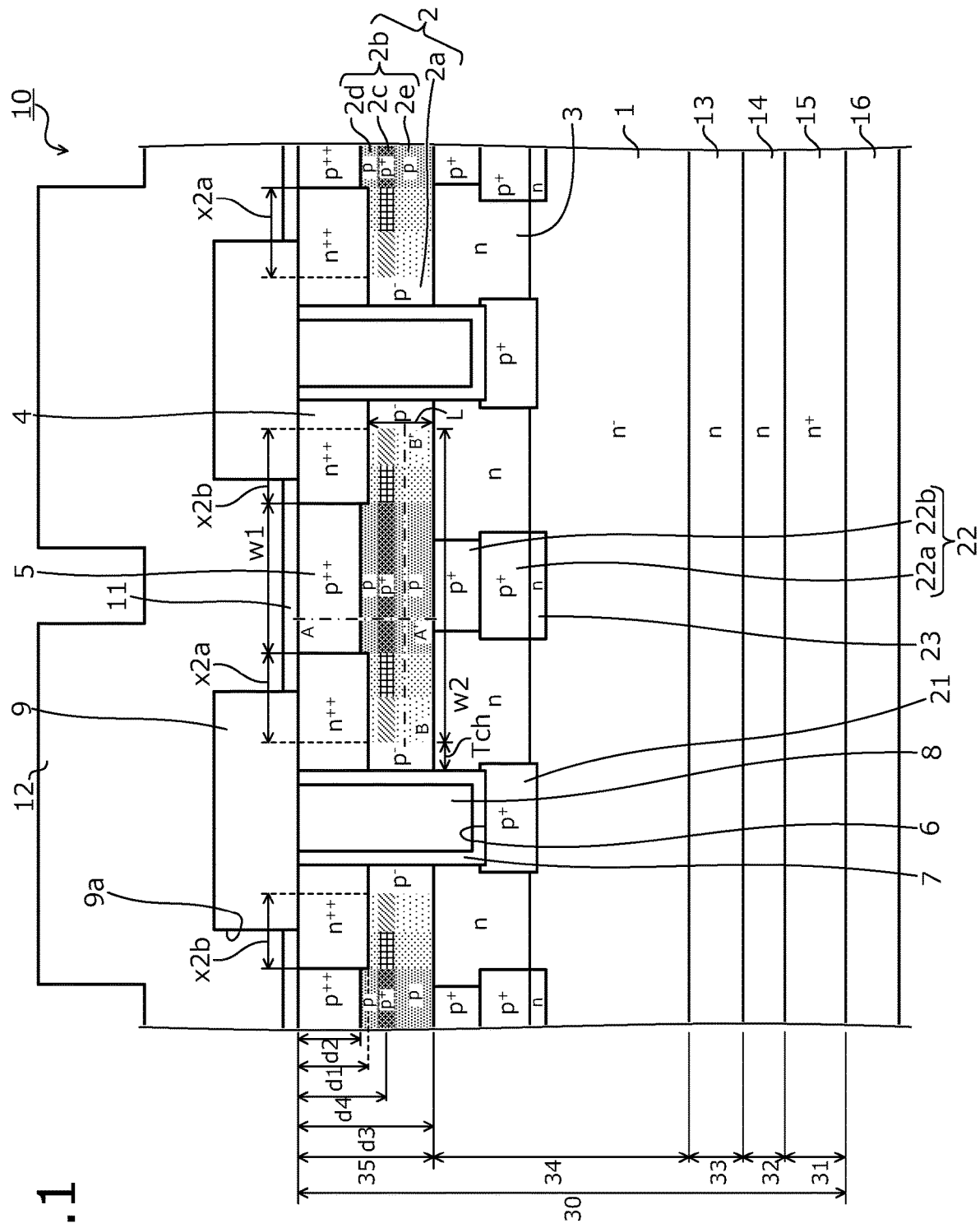
FIG. 1 is a cross-sectional view of a structure of a silicon carbide semiconductor device according to a first embodiment.

A structure of a silicon carbide semiconductor device according to a first embodiment will be described. FIG. 1 is a cross-sectional view of a structure of the silicon carbide semiconductor device according to the first embodiment. In FIG. 1, two adjacent unit cells (functional units of an element) of a vertical MOSFET in which silicon carbide is used as a semiconductor material are depicted. Further, in FIG. 1, only a portion of the unit cells disposed in an active region are depicted and an edge termination region that surrounds a periphery of the active region is not depicted (similarly in FIGS. 5 to 10). The active region is a region in which current flows when the semiconductor device is in an ON state.

The edge termination region is a region between the active region and a chip side surface (edge of a semiconductor substrate 30), and is a region of an type drift region 1, mitigating electric field at a front side of the semiconductor substrate 30 and sustaining breakdown voltage (withstand voltage). In the edge termination region, for example, an edge termination structure is disposed such as a RESURF, a field plate, a p-type region configuring a junction termination extension (JTE) structure, a guard ring, etc. Breakdown voltage is a voltage limit at which no errant operation or destruction of the semiconductor device occurs.

Figure 2:
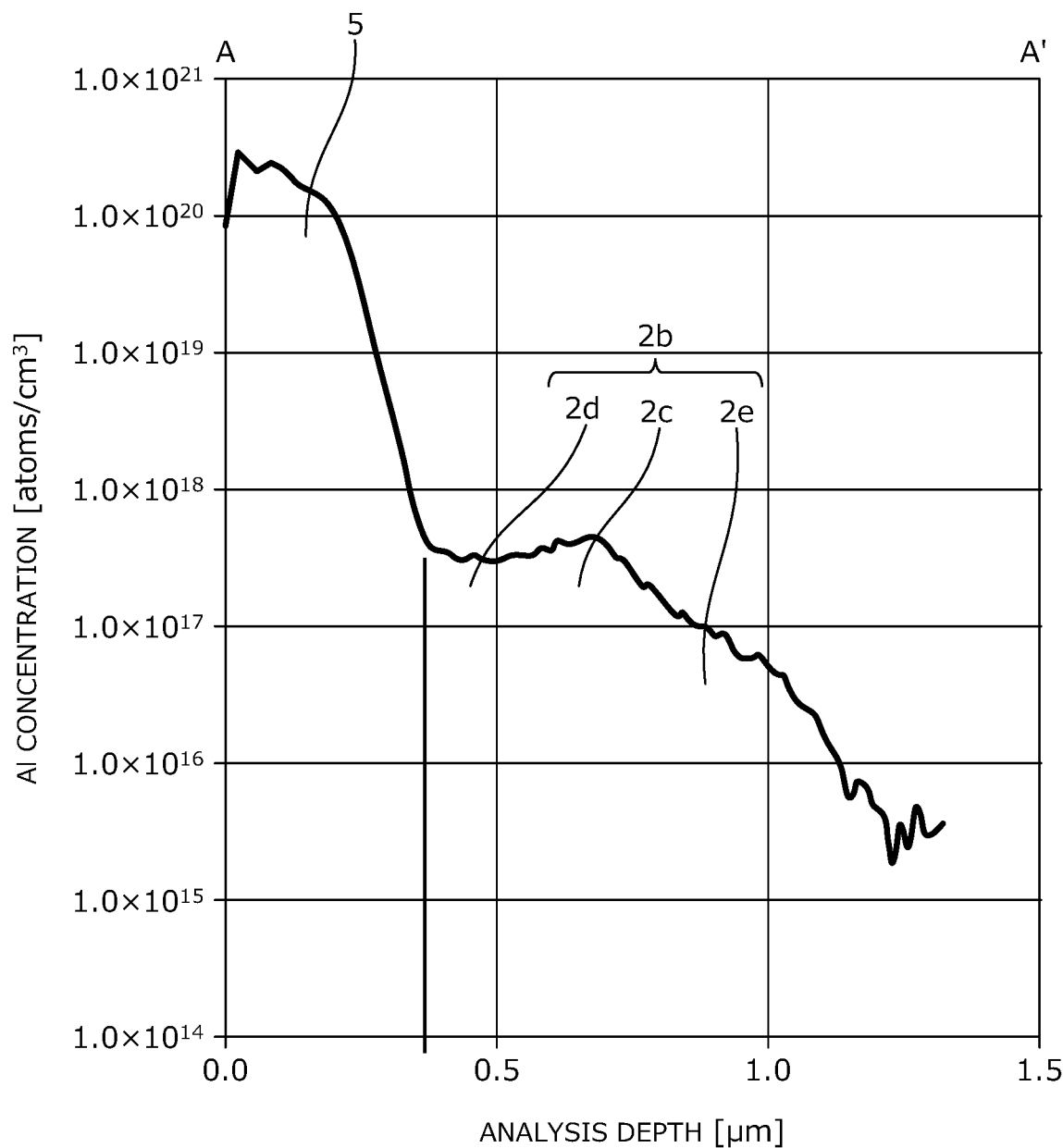
FIG. 2 is a characteristics diagram of impurity concentration distribution at cutting line A-A' in FIG. 1.
Figure 3:
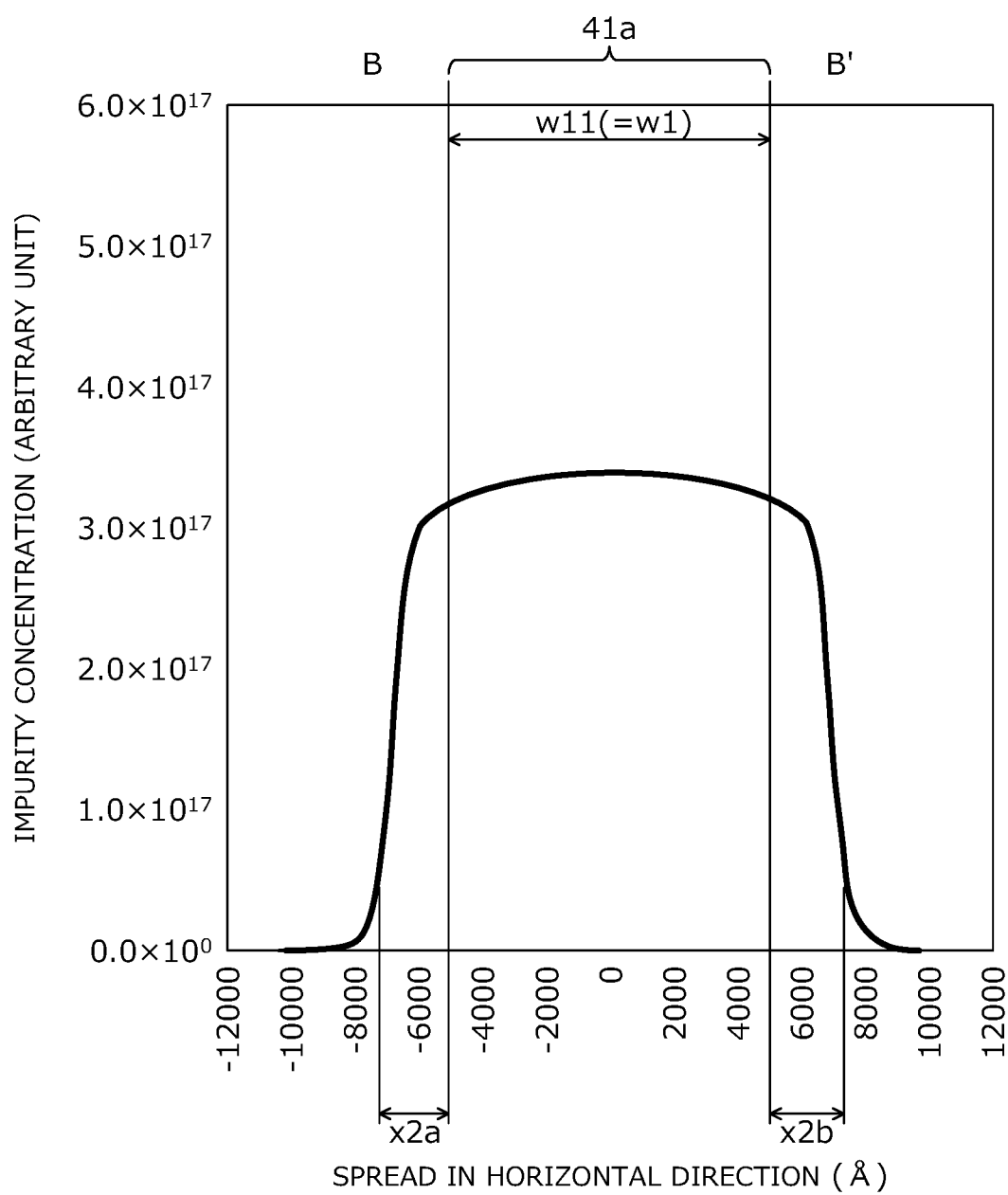
FIG. 3 is a characteristics diagram of impurity concentration distribution at cutting line B-B' in FIG. 1.

FIGS. 2 and 3 are characteristics diagrams of impurity concentration distribution at cutting line A-A' and cutting line B-B' in FIG. 1, respectively. FIG. 2 depicts the impurity concentration distribution of a p-type high-concentration region 2b of a p-type base region 2, in a depth direction (a vertical direction) from a front surface of the semiconductor substrate 30. FIG. 3 depicts an effective impurity concentration distribution of the p-type high-concentration region 2b of the p-type base region 2, in a direction parallel (horizontal direction) to the front surface of the semiconductor substrate 30. The impurity concentration distributions in FIGS. 2 and 3 are obtained by vertical direction diffusion and horizontal direction diffusion of a p-type impurity, occurring due to one session of an ion implantation 43 for forming the p-type high-concentration region 2b described hereinafter (refer to FIG. 7).

A silicon carbide semiconductor device 10 according to the first embodiment depicted in FIGS. 1 to 3 is a vertical MOSFET that includes a trench gate structure in the active region of the semiconductor substrate 30 and includes the p-type base region (third semiconductor region) 2 configured by portions 2a, 2b of differing impurity concentrations. The semiconductor substrate 30 is a silicon carbide epitaxial substrate (semiconductor chip) in which silicon carbide epitaxial layers 32, 33, 34, 35 forming n-type buffer regions 14, 13, the n$^-$-type drift region 1, and the p-type base region 2 are sequentially formed by epitaxial growth at a front surface of an n$^+$-type starting substrate (third semiconductor layer) 31 forming an n$^+$-type drain region 15.

A MOS gate having a trench gate structure is provided at a front surface (main surface on a p$^-$-type silicon carbide epitaxial layer (second semiconductor layer) 35 side) of the semiconductor substrate 30. The MOS gate is configured by the p-type base region 2, an n$^{++}$-type source region (first semiconductor region) 4, a p$^{++}$-type contact region (second semiconductor region) 5, a trench 6, a gate insulating film 7, and a gate electrode 8. The trench 6 penetrates the p$^-$-type silicon carbide epitaxial layer 35 in the depth direction from the front surface of the semiconductor substrate 30 and reaches the n$^-$-type silicon carbide epitaxial layer (first semiconductor layer) 34. The depth direction is a direction from the front surface of the semiconductor substrate 30 to a rear surface.

The trench 6, for example, is disposed in a striped shape extending in a direction parallel to the front surface of the semiconductor substrate 30. In the trench 6, the gate insulating film 7 is provided along an inner wall of the trench 6. The gate electrode 8 is provided on the gate insulating film 7 so as to be embedded in the trench 6. Between (mesa region) adjacent trenches 6, as described hereinafter, the p-type base region 2, the n$^{++}$-type source region 4, and the p$^{++}$-type contact region 5 are selectively provided. One unit cell is configured by portions between centers of adjacent mesa regions.

In a surface layer on a side of the n$^-$-type silicon carbide epitaxial layer 34 facing toward a source (toward a source electrode 12), an n-type current spreading region 3 is provided in contact with the p$^-$-type silicon carbide epitaxial layer 35 (the p-type base region 2). The n-type current spreading region 3 is an n-type region having a same conductivity type as the n$^-$-type drift region 1 and an impurity concentration higher than that of the n$^-$-type drift region 1 and is a so-called current spreading layer (CSL). A bottom of the trench 6 terminates in the n-type current spreading region 3.

The n-type current spreading region 3 reaches a side wall of the trench 6, in a direction parallel to the front surface of the semiconductor substrate 30. Further, the n-type current spreading region 3, from an interface with the p-type base region 2, reaches a position deeper toward a drain (toward a drain electrode 16) than is the bottom of the trench 6. A portion of the n$^-$-type silicon carbide epitaxial layer 34 excluding the n-type current spreading region 3 and an n-type region 23 described hereinafter is the n$^-$-type drift region 1. The n-type current spreading region 3 is provided between the n$^-$-type drift region 1 and the p-type base region 2, and is in contact with the n$^-$-type drift region 1 and the p-type base region 2.

In the n-type current spreading region 3, first and second p$^+$-type regions 21, 22 are selectively provided. The first p$^+$-type region 21, at a position deeper toward the drain than is an interface between the p-type base region 2 and the n-type current spreading region 3, is disposed separated from the p-type base region 2. Further, the first p$^+$-type region 21 is provided closer to the drain than is the trench 6, and faces the bottom of the trench 6 in the depth direction. A depth of the first p$^+$-type region 21 may be variously changed and the first p$^+$-type region 21 may be in contact with the n$^-$-type drift region 1.

The second p$^+$-type region 22 is provided between (mesa region) the adjacent trenches 6, separated from the first p$^+$-type region 21 and in contact with the p-type base region 2. The second p$^+$-type region 22 suffices to be positioned closer to the drain than is the bottom of the trench 6 and may be in contact with the n$^-$-type drift region 1. At positions deeper toward the drain than is the bottom of the trench 6, pn junctions between the first and the second p$^+$-type regions 21, 22 and the n-type current spreading region 3 (or the n$^-$-type drift region 1) are formed, whereby at the bottom of the trench 6, electric field concentration at the gate insulating film 7 may be mitigated.

The second p$^+$-type region 22, for example, may be disposed at a center portion of the mesa region. Directly beneath the second p$^+$-type region 22, the n-type region 23 may be selectively provided in contact with the second p$^+$-type region 22. The n-type region 23 has a function of reducing breakdown voltage near the second p$^+$-type region 22 to be lower than breakdown voltage near the first p$^+$-type region 21. The n-type region 23 is provided, whereby breakdown voltage near a center of the mesa region is lower than breakdown voltage near the bottom of the trench 6, thereby enabling avalanche breakdown to be made to occur more easily near the center of the mesa region than near the bottom of the trench 6. The second p$^+$-type region 22 and the n-type region 23 may be omitted.

In the p$^-$-type silicon carbide epitaxial layer 35, the n$^{++}$-type source region 4 and the p$^{++}$-type contact region 5 are selectively provided and are in contact with each other. The n$^{++}$-type source region 4 and the p$^{++}$-type contact region 5 are exposed at the front surface of the semiconductor substrate 30. The n$^{++}$-type source region 4 is disposed in contact with a side wall of the trench 6 and faces the gate electrode 8, across the gate insulating film 7 at the side wall of the trench 6. The n$^{++}$-type source region 4 reaches a depth d1 of, for example, about 0.45 µm from the front surface of the semiconductor substrate 30. The p$^{++}$-type contact region 5 is disposed closer to the center of the mesa region than is the n$^{++}$-type source region 4. A width w1 of the p$^{++}$-type contact region 5, for example, may be 1.0 µm.

The p$^{++}$-type contact region 5 terminates at a depth d2 of, for example, about 0.4 µm, which is shallower from the front surface of the semiconductor substrate 30 than is the depth d1 of the n$^{++}$-type source region 4. The p$^{++}$-type contact region 5 may reach a depth d2 that is deeper from the front surface of the semiconductor substrate 30 than is the depth d1 of the n$^{++}$-type source region 4. In the p$^-$-type silicon carbide epitaxial layer 35, excluding the n$^{++}$-type source region 4 and the p$^{++}$-type contact region 5, a portion closer to the drain than are the n$^{++}$-type source region 4 and the p$^{++}$-type contact region 5 is the p-type base region 2. A depth d3 from the front surface of the semiconductor substrate 30 to the interface between the p-type base region 2 and the n-type current spreading region 3, for example, is about 1.1 µm.

In the p-type base region 2, an impurity concentration is higher at a portion separated from the side wall of the trench 6 by a predetermined distance in a direction parallel to the front surface of the semiconductor substrate 30 than an impurity concentration at a portion (hereinafter, p$^-$-type channel region) 2a along the side wall of the trench 6. The p$^-$-type channel region (low-impurity-concentration region) 2a is a portion where a channel (n-type inversion layer) is formed when the MOSFET is ON, and is provided directly beneath (toward the drain) the n$^{++}$-type source region 4, along the side wall of the trench 6. The p⁻-type channel region 2a is in contact with the n⁺⁺-type source region 4 and the n-type current spreading region 3, and is in contact with the gate insulating film 7 at the side wall of the trench 6.

The p-type high-concentration region (high-impurity-concentration region) 2b is provided directly beneath the p⁺⁺-type contact region 5 and extends to directly beneath the n⁺⁺-type source region 4. The p-type high-concentration region 2b is adjacent to the p⁻-type channel region 2a in a direction parallel to the front surface of the semiconductor substrate 30. The p-type high-concentration region 2b suppresses depletion layers from spreading in the p-type base region 2, from a pn junction between the p-type base region 2 and the n⁺⁺-type source region 4 and a pn junction between the p-type base region 2 and the n-type current spreading region 3, respectively, and functions as a so-called HALO region. The p-type high-concentration region 2b is provided, whereby even when a thickness (=the channel length L) of the p⁻-type channel region 2a is made thinner to reduce ON resistance, increases in short channel effects when the MOSFET is ON may be suppressed and decreases in the gate threshold voltage may be suppressed. When the p-type high-concentration region 2b has an impurity concentration that is higher than that of the p⁻-type channel region 2a, an effect as a HALO region is obtained.

The p-type high-concentration region 2 is configured by first, second and third portions 2c, 2d, 2e formed by diffusion of a p-type impurity in the depth direction, occurring during the ion implantation 43 (refer to FIG. 7) for forming the p-type high-concentration region 2b described hereinafter. The first to the third portions 2c to 2e of the p-type high-concentration region 2b are positioned at differing depths from the front surface of the semiconductor substrate 30. Further, by diffusion (hereinafter, the horizontal direction diffusion) of the p-type impurity in a direction parallel to the front surface of the semiconductor substrate 30 occurring during the ion implantation 43 for forming the p-type high-concentration region 2b, the first to the third portions 2c to 2e of the p-type high-concentration region 2b extend away from the p⁺⁺-type contact region 5, from a center of the mesa region toward both trenches 6 and are in contact with the p⁻-type channel region 2a.

The first portion 2c (hatched portion) of the p-type high-concentration region 2b shows a peak value (maximum value: hereinafter, peak value) of the impurity concentration of the p-type high-concentration region 2b. The second and the third portions 2d, 2e (portions with lighter hatching than that of the first portion 2c) of the p-type high-concentration region 2b have impurity concentrations that are lower than that of the first portion 2c. The second and the third portions 2d, 2e of the p-type high-concentration region 2b are respectively adjacent to sides of the first portion 2c respectively facing toward the source and the drain. The second portion 2d of the p-type high-concentration region 2b is in contact with the p⁺⁺-type contact region 5. The third portion 2e of the p-type high-concentration region 2b is in contact with the n-type current spreading region 3. In FIG. 1, impurity concentration distribution of the p-type high-concentration region 2b resulting from the vertical direction diffusion and the horizontal direction diffusion of the p-type impurity is indicated by different hatching (similarly in FIG. 8).

Lengths x2a, x2b that the first portion 2c of the p-type high-concentration region 2b extends away from the p⁺⁺-type contact region 5, from both ends of the p⁺⁺-type contact region 5 toward the respective trenches 6, for example, are about 0.2 μm, independent of conditions of the ion implantation 43 for forming the p-type high-concentration region 2b. The second and the third portions 2d, 2e of the p-type high-concentration region 2b also extend toward the respective the trenches 6 by substantially a same length as that of the first portion 2c of the p-type high-concentration region 2b. In other words, a width w2 of the p-type high-concentration region 2b is about 0.4 μm (=0.2 μm×2) wider than the width w1 of the p⁺⁺-type contact region 5.

The first portion 2c of the p-type high-concentration region 2b suffices to be separated from the side wall of the trench 6 by a distance (hereinafter, separation distance) Tch in a range, for example, from about 0.04 μm to 0.2 μm. When the separation distance Tch of the first portion 2c of the p-type high-concentration region 2b from the side wall of the trench 6 is less than the lower limit above, the width of the p⁻-type channel region 2a is too narrow, whereby function as a MOSFET does not occur. When the separation distance Tch is exceeds the upper limit above, an effect of the p-type high-concentration region 2b as a HALO region is not obtained.

A process margin for forming the p-type high-concentration region 2b may be secured the wider the separation distance Tch is set. Therefore, disappearance of the p⁻-type channel region 2a due to the horizontal direction diffusion of the p-type impurity occurring during the ion implantation 43 for forming the p-type high-concentration region 2b may be suppressed. The separation distance Tch may be set to be in a range, for example, from about 0.06 μm to 0.1 μm, whereby the tradeoff relationship between reducing the ON resistance and suppressing decreases of the gate threshold voltage may be further improved.

The first portion 2c of the p-type high-concentration region 2b is disposed separated from the n⁺⁺-type source region 4. The first portion 2c of the p-type high-concentration region 2b may be disposed separated from the n⁺⁺-type source region 4, at a position of a depth at which the impurity concentration of the n⁺⁺-type source region 4 is not reduced by the vertical direction diffusion of the p-type impurity occurring during the ion implantation 43 for forming the p-type high-concentration region 2b. The first portion 2c of the p-type high-concentration region 2b may be in contact with the p⁺⁺-type contact region 5.

A depth position of the peak concentration of the first portion 2c of the p-type high-concentration region 2b suffices to be positioned in the p-type high-concentration region 2b and is positioned at a depth d4 in a range, for example, from about 0.4 μm to 1.5 μm from the front surface of the semiconductor substrate 30. The peak concentration of the first portion 2c of the p-type high-concentration region 2b may be in a range, for example, from about $1\times10^{17}/cm^3$ to $1\times10^{18}/cm^3$. The size of the effect of the HALO region by the p-type high-concentration region 2b is determined by the peak concentration of the first portion 2c of the p-type high-concentration region 2b.

The impurity concentration of the p-type high-concentration region 2b in the depth direction is indicated by the peak concentration in the first portion 2c, and decreases with increasing proximity to the source and to the drain, from the depth position of the peak concentration (refer to FIG. 2). The impurity concentration of the p-type high-concentration region 2b, in a direction parallel to the front surface of the semiconductor substrate 30 is indicated by the peak concentration at a portion directly beneath the p⁺⁺-type contact region 5, and decreases with increasing proximity to the trenches 6 in a direction away from the p⁺⁺-type contact region 5 (refer to FIG. 3).

In the p-type high-concentration region $2b$, the first portion $2c$ may have an end shape positioned closer to the trench 6 in a direction parallel to the front surface of the semiconductor substrate 30 than are the second and the third portions $2d$, $2e$. In particular, for example, an interface between the p-type high-concentration region $2b$ and the $p^-$-type channel region $2a$ may be curved in a substantially arc shape in which the p-type high-concentration region $2b$ protrudes toward the trench 6 in a direction parallel to the front surface of the semiconductor substrate 30 and at the first portion $2c$ of the p-type high-concentration region $2b$, a distance to the side wall of the trench 6 is shorter than that for the second and the third portions $2d$, $2e$ (not depicted).

An interlayer insulating film 9 is provided at the front surface of the semiconductor substrate 30 overall, covering the gate electrode 8. The interlayer insulating film 9 may be, for example, a borophosphosilicate glass (BPSG) film or a non-doped silicate glass (NSG) film. In each mesa region, a contact hole $9a$ is provided that penetrates the interlayer insulating film 9 in the depth direction and reaches the semiconductor substrate 30. A width of the contact hole $9a$ may be, for example, 1.5 μm. In the contact hole $9a$, the $n^{++}$-type source region 4 and the $p^{++}$-type contact region 5 are exposed.

In the contact hole $9a$, on the front surface of the semiconductor substrate 30, a silicide layer (first electrode) 11 forming an ohmic contact with the semiconductor substrate 30 is provided. The silicide layer 11 may be, for example, a nickel silicide (NiSi or NiSi$_2$) layer. At a surface of the silicide layer 11 and a surface of the interlayer insulating film 9, the source electrode 12 is provided so as to be embedded in the contact holes $9a$. The source electrode 12 is electrically connected to the $n^{++}$-type source region 4 and the $p^{++}$-type contact region 5, via the silicide layer 11.

The source electrode 12 is, for example, an aluminum alloy layer containing aluminum (Al) such as aluminum-silicon (AlSi). The source electrode 12 may be a stacked film in which a barrier metal and the aluminum alloy layer are sequentially stacked. The barrier metal has a function of preventing interaction and/or atomic diffusion between regions that face each other across the barrier metal. The barrier metal may be, for example, a titanium (Ti) film and a titanium nitride (TiN) film.

At a rear surface (rear surface of the $n^+$-type starting substrate 31 forming the $n^+$-type drain region 15) side of the semiconductor substrate 30, the n-type buffer regions 13, 14 and the $n^+$-type drain region 15 are provided. The n-type buffer region 13 is disposed at a position that is deeper from the rear surface of the semiconductor substrate 30 than are the n-type buffer region 14 and the $n^+$-type drain region 15. The n-type buffer region 14 is provided between the n-type buffer region 13 and the $n^+$-type drain region 15. The n-type buffer regions 13, 14 may be omitted. The $n^+$-type drain region 15 is exposed at the rear surface of the semiconductor substrate 30.

The n-type buffer region 13 is, for example, a recombination promotion layer containing an element that forms recombination centers (hole trapping centers). Hole density during bipolar operation may be reduced by recombination at the n-type buffer region 13, and basal plane dislocations (BPDs) of the $n^+$-type starting substrate 31 become stacking defects, enabling expansion into the $n^-$-type drift region 1 to be prevented. The n-type buffer region 14 is a dislocation conversion layer that suppresses stacking defects generated with the basal plane dislocations of the $n^+$-type starting substrate 31 as starting points from being propagated to the $n^-$-type drift region 1.

The drain electrode (second electrode) 16 is provided at the rear surface of the semiconductor substrate 30 overall. The drain electrode 16 is electrically connected to the $n^+$-type drain region 15, via a silicide layer (not depicted). The silicide layer of the rear surface of the semiconductor substrate 30 may be, for example, may be a stacked film formed by a stacked molybdenum (Mo) film and a nickel (Ni) film forming an ohmic contact with the semiconductor substrate 30. Thicknesses of the molybdenum film and the nickel may be 0.7 μm and 0.1 μm, respectively.

The drain electrode 16 also serves as a drain pad. The drain electrode 16 may be, for example, a stacked film in which a titanium (Ti) film, a nickel (Ni) film, and a gold (Au) film are sequentially stacked. Thicknesses of the titanium film, the nickel film, and the gold film may be 0.25 μm, 1.45 μm, and 0.1 μm, respectively.

Figure 4:
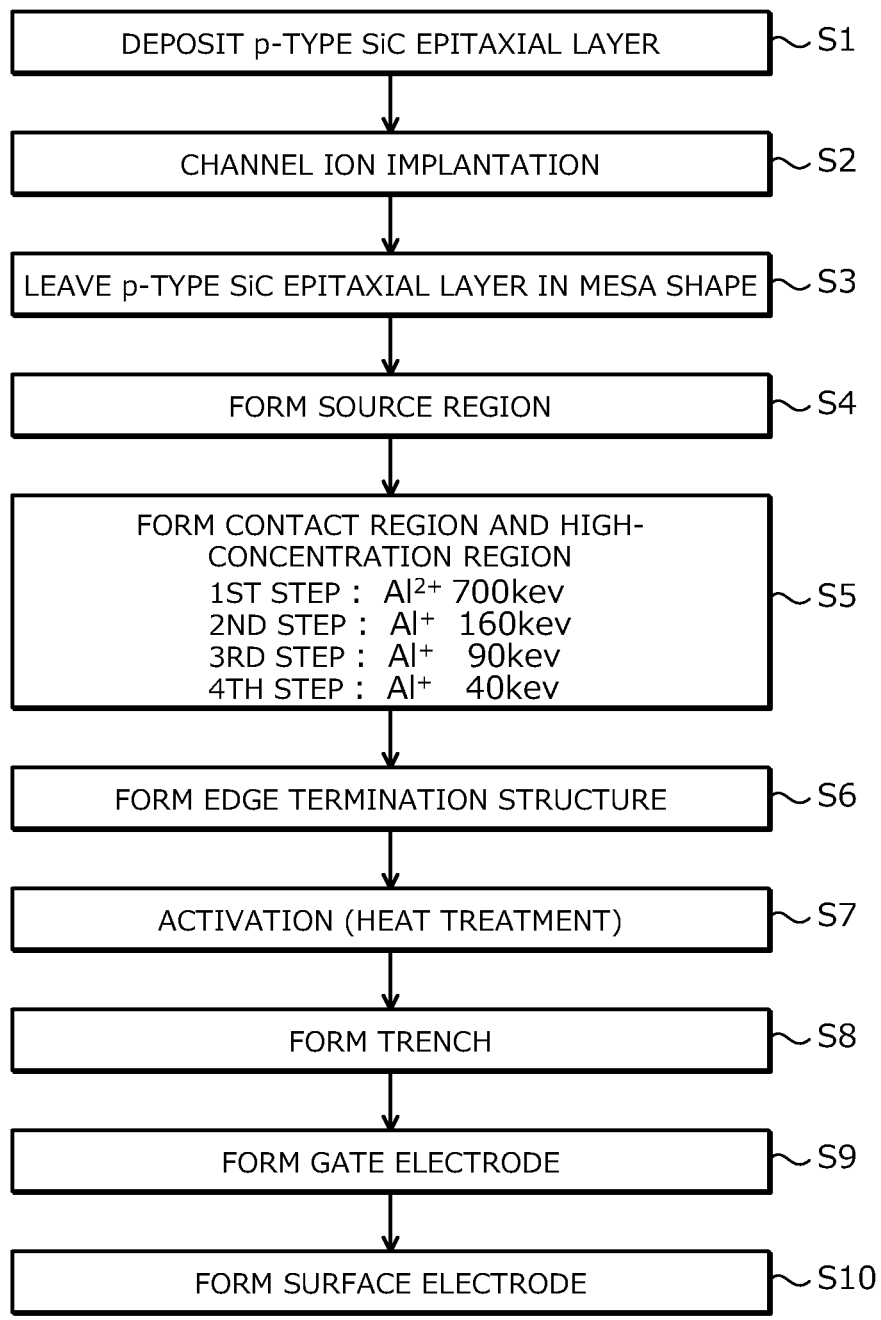
FIG. 4 is a flowchart of an outline of a method of manufacturing the silicon carbide semiconductor device according to the first embodiment.

Next, a method of manufacturing the silicon carbide semiconductor device 10 according to the first embodiment will be described. FIG. 4 is a flowchart of an outline of the method of manufacturing the silicon carbide semiconductor device according to the first embodiment. FIGS. 5, 6, 7, and 8 are cross-sectional views of the silicon carbide semiconductor device according to the first embodiment during manufacture. In FIGS. 5 to 8, the n-type buffer regions 14, 13 (refer to FIG. 1) are not depicted (similarly in FIGS. 9 and 10). Here, as an example, a case will be described in which the depth d1 of the $n^{++}$-type source region 4 from the front surface of the semiconductor substrate 30 is shallower than the depth d2 of the $p^{++}$-type contact region 5 from the front surface of the semiconductor substrate 30 (similarly in FIG. 7).

Figure 5:
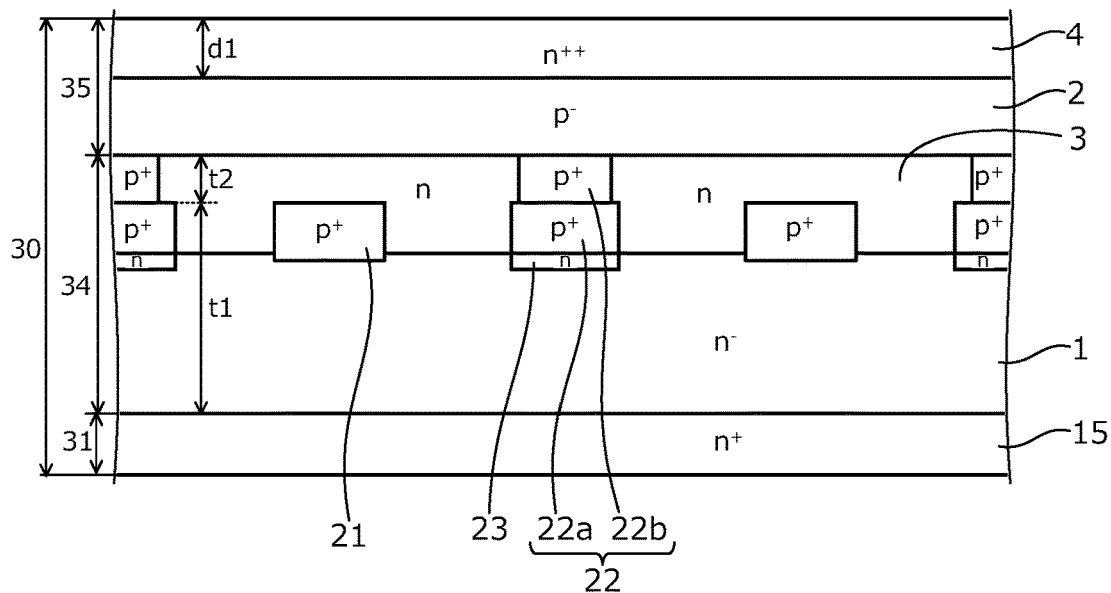
FIG. 5 is a cross-sectional view of the silicon carbide semiconductor device according to the first embodiment during manufacture.

First, as depicted in FIG. 5, the $n^+$-type starting substrate (semiconductor wafer) 31 that becomes the $n^+$-type drain region 15 is prepared. Next, at the front surface of the $n^+$-type starting substrate 31, the silicon carbide epitaxial layers 32, 33 that become the n-type buffer regions 14, 13 (refer to FIG. 1) are sequentially formed by epitaxial growth. Furthermore, at a surface of the n-type the silicon carbide epitaxial layer 33, the $n^-$-type silicon carbide epitaxial layer 34 that becomes the $n^-$-type drift region 1 is formed by epitaxial growth to have a thickness t1 that is thinner than that of the $n^-$-type silicon carbide epitaxial layer 34 after product completion.

Next, by photolithography and ion implantation of a p-type impurity, the first $p^+$-type region 21 and a $p^+$-type region $22a$ are each selectively formed in a surface layer of the $n^-$-type silicon carbide epitaxial layer 34. The $p^+$-type region $22a$ is a portion of the second $p^+$-type region 22. Next, by photolithography and ion implantation of an n-type impurity, the n-type region 23 is selectively formed directly beneath the $p^+$-type region $22a$.

Next, by photolithography and ion implantation of an n-type impurity, for example, spanning the active region overall, in the surface layer of the $n^-$-type silicon carbide epitaxial layer 34, the n-type current spreading region 3 is formed. A formation sequence of the n-type current spreading region 3, the first $p^+$-type region 21 and the $p^+$-type region $22a$, and the n-type region 23 may be interchanged. A portion of the $n^-$-type silicon carbide epitaxial layer 34 closer to the drain than are the n-type current spreading region 3 and the n-type region 23 become the $n^-$-type drift region 1.

Next, by epitaxial growth, a thickness of the $n^-$-type silicon carbide epitaxial layer 34 is increased by a predetermined thickness t2. Next, by photolithography and ion implantation of a p-type impurity, at a portion where the thickness of the $n^-$-type silicon carbide epitaxial layer 34 is increased, a p$^+$-type region 22b is selectively formed at a depth reaching the p$^+$-type region 22a. A width of the p$^+$-type region 22b may be narrower than a width of the p$^+$-type region 22a. The p$^+$-type regions 22a, 22b are connected in the depth direction, whereby the second p$^+$-type region 22 is formed.

Next, by photolithography and ion implantation of an n-type impurity, for example, spanning the active region overall, at the portion where the thickness of the n$^-$-type silicon carbide epitaxial layer 34 is increased, an n-type region that becomes the n-type current spreading region 3 is formed, whereby the thickness of the n-type current spreading region 3 is increased. As a result, between the first and the second p$^+$-type regions 21, 22, the n-type current spreading region 3 is formed so as to be in contact with the first and the second p$^+$-type regions 21, 22. A formation sequence of the p$^+$-type region 22b, and the n-type region that becomes the n-type current spreading region 3 may be interchanged.

Next, on the n$^-$-type silicon carbide epitaxial layer 34, the p$^-$-type silicon carbide epitaxial layer 35 that becomes the p-type base region 2 is formed by epitaxial growth (step S1: second process). By the processes up to here, the semiconductor substrate (semiconductor wafer) 30 in which the silicon carbide epitaxial layers 32 to 35 are sequentially deposited on the n$^+$-type starting substrate 31 is fabricated. The p$^-$-type silicon carbide epitaxial layer 35 may be fabricated by ion implanting a p-type impurity into an n$^-$-type epitaxial film. Next, in the p$^-$-type silicon carbide epitaxial layer 35, ion implantation (channel ion implantation) of an n-type impurity or a p-type impurity for gate threshold voltage control is performed (step S2).

Next, an outer peripheral portion of the p$^-$-type silicon carbide epitaxial layer 35 is removed, leaving in the active region, the p$^-$-type silicon carbide epitaxial layer 35 in a plateau (mesa) shape (step S3). As a result, in the edge termination region, the n$^-$-type silicon carbide epitaxial layer 34 is exposed at the front surface of the semiconductor substrate 30. Next, by photolithography and ion implantation of an n-type impurity, for example, spanning the active region overall, the n$^{++}$-type source region 4 is formed in a surface layer of the p$^-$-type silicon carbide epitaxial layer 35 (step S4: third process).

Figure 6:
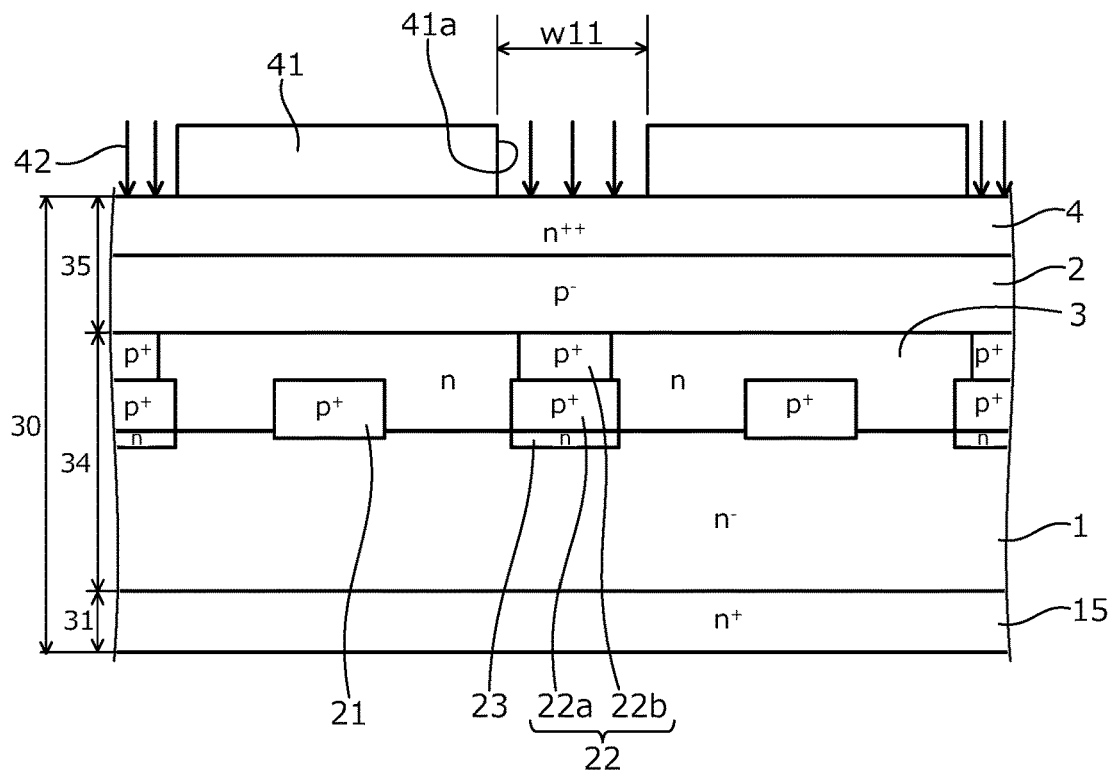
FIG. 6 is a cross-sectional view of the silicon carbide semiconductor device according to the first embodiment during manufacture.

Next, as depicted in FIG. 6, at a surface of the p$^-$-type silicon carbide epitaxial layer 35, an ion implantation mask 41 having openings 41a at portions corresponding to formation regions of the p$^{++}$-type contact region 5 is formed. Next, using the ion implantation mask 41 as a mask, a p-type impurity is ion implanted from a direction substantially orthogonal to the front surface of the semiconductor substrate 30 (first ion implantation) 42, selectively forming in the surface layer of the p$^-$-type silicon carbide epitaxial layer 35, the p$^{++}$-type contact region 5 at the depth d2, penetrating the n$^{++}$-type source region 4 in the depth direction (part 1 of step S5: fifth process). The ion implantation 42 may be performed in multiple steps (multiple times).

For example, by the ion implantation 42 of multiple steps (in FIG. 4, second to fourth steps) of differing acceleration energies, the p$^{++}$-type contact region 5 having a box profile is formed. Conditions of the 3-step the ion implantation 42 may be, for example, monovalent aluminum (Al$^+$) as a dopant, and acceleration energies therefore may be, for example, 160 keV, 90 keV, and 40 keV, respectively. A portion of the p$^-$-type silicon carbide epitaxial layer 35 excluding the n$^{++}$-type source region 4 and the p$^{++}$-type contact region 5 becomes the p-type base region 2.

Figure 7:
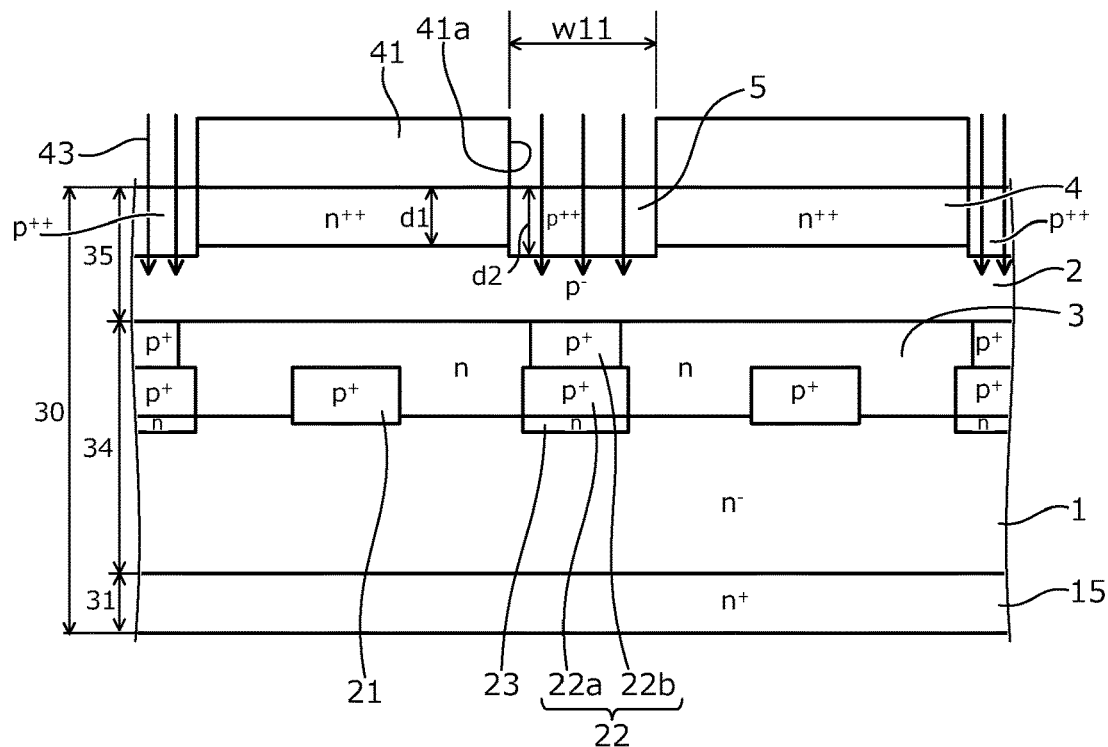
FIG. 7 is a cross-sectional view of the silicon carbide semiconductor device according to the first embodiment during manufacture.

Further, in continuation with the ion implantation 42 described, as depicted in FIG. 7, using the same ion implantation mask 41, an ion implantation (second ion implantation) 43 of ion implanting a p-type impurity from a direction substantially orthogonal to the front surface of the semiconductor substrate 30 is performed, selectively forming the p-type high-concentration region 2b in the p$^-$-type silicon carbide epitaxial layer 35 (part 2 of step S5: sixth process). The ion implantation 43 is performed at a higher acceleration energy than that of the ion implantation 42 for forming the p$^{++}$-type contact region 5 (in FIG. 4, first step). In the process at step S5, a sequence of the ion implantations 42, 43 may be interchanged.

Figure 8:
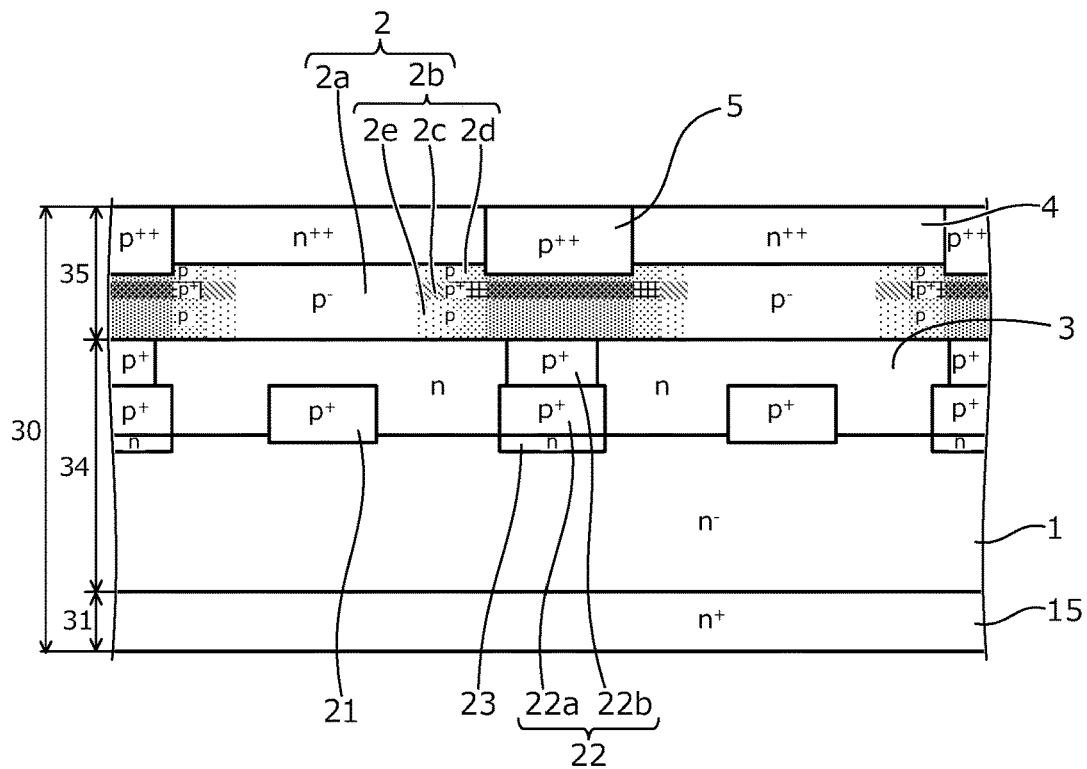
FIG. 8 is a cross-sectional view of the silicon carbide semiconductor device according to the first embodiment during manufacture.

The ion implantation mask 41 having the openings 41a at portions corresponding to formation regions of the p$^{++}$-type contact region 5 is used, thereby enabling the ion implantation 43 of a p-type impurity directly beneath the p$^{++}$-type contact region 5. As depicted in FIG. 8, the p-type high-concentration region 2b that has the first to the third portions 2c to 2e of differing impurity concentrations is formed directly beneath the p$^{++}$-type contact region 5 by the vertical direction diffusion of the p-type impurity by the ion implantation 43. The first portion 2c of the p-type high-concentration region 2b is formed near a depth of a range of the ion implantation 43, and the second and the third portions 2d, 2e are respectively formed relatively closer to the source and the drain from the depth of the range of the ion implantation 43.

Further, the p-type impurity implanted by the ion implantation 43 diffuses in the horizontal direction away from the p$^{++}$-type contact region 5 by the lengths x2a, x2b (refer to FIG. 1) that are about 0.2 μm from ends of the openings 41a of the ion implantation mask 41. Therefore, the p-type high-concentration region 2b extends from directly beneath the p$^{++}$-type contact region 5 to directly beneath the n$^{++}$-type source region 4. The width w2 of the p-type high-concentration region 2b is wider than a width w11 of the openings 41a of the ion implantation mask 41 by about 0.4 μm (=0.2 μm×2). In the vertical direction and the horizontal direction, peak concentrations of the impurity concentration of the p-type high-concentration region 2b are determined by a dose amount of the ion implantation 43.

Conditions of the ion implantation 43 may be, for example, bivalent aluminum (Al$^{2+}$) as a dopant and, for example, 700 keV as an acceleration energy therefore. The ion implantation 43 may be performed in multiple steps (multiple times). A portion of the p-type base region 2 excluding the p-type high-concentration region 2b becomes the p$^-$-type channel region 2a of the p-type base region 2. In other words, the p$^-$-type channel region 2a of the p-type base region 2, without introduction of an impurity by the ion implantations 42, 43, is a region having an impurity concentration equal to that during epitaxial growth of the p$^-$-type silicon carbide epitaxial layer 35. The process at step S4 and the process at step S5 may be interchanged.

Next, after the ion implantation mask 41 is removed, a predetermined edge termination structure is formed in the edge termination region (step S6). For ion implantation masks used in all ion implantations performed in these manufacturing processes, resist films may be used as the masks or oxide films may be used as the masks. Next, a heat treatment for activating all the impurities ion implanted into the semiconductor substrate 30 is performed (step S7). Next, the trench 6 is formed penetrating the n$^{++}$-type source region 4 and the p$^-$-type channel region 2a of the p-type base region 2, and reaching the first p$^+$-type region 21 in the n-type current spreading region 3 (step S8: seventh process).

Next, by a general method, for example, poly-silicon (poly-Si) is embedded in the trench 6, via the gate insulating film 7, whereby the gate electrode 8 is formed (step S9: eighth process). Thereafter, at the front surface of the semiconductor substrate 30, the silicide layer 11 and the source electrode 12 are formed as the surface electrode. At the rear surface of the semiconductor substrate 30, a silicide layer (not depicted) and the drain electrode 16 are formed as a surface electrode (step S10: ninth and tenth processes). Thereafter, the semiconductor substrate 30 is diced (cut) into individual chips, whereby the silicon carbide semiconductor device 10 including the p-type base region that has the p-type high-concentration region 2b is completed.

As described above, according to the first embodiment, the p-type base region has at a portion separated from the trench side wall, a p-type high-concentration region in contact with the p$^-$-type channel region. The impurity concentration of the p-type high-concentration region shows a peak concentration directly beneath the p$^{++}$-type contact region, and in a direction parallel to the front surface of the semiconductor substrate, decreases toward the p$^-$-type channel region side. The p-type high-concentration region functions as a HALO region and therefore, increases in short channel effects are suppressed and decreases in the gate threshold voltage are suppressed, thereby enabling both a high gate threshold voltage and a low ON resistance to be achieved, and leak current during the OFF state may be suppressed.

Further, according to the first embodiment, using the ion implantation mask used in the ion implantation for forming the p$^{++}$-type contact region, a p-type impurity is ion implanted from a direction substantially vertical the front surface of the semiconductor substrate, whereby the p-type high-concentration region may be formed having the impurity concentration distribution described above. In forming the p-type high-concentration region that becomes a HALO region, oblique ion implantation to the trench side wall is not performed as is conventionally and therefore, the p-type high-concentration region may be formed with dimensional accuracy. Therefore, variation of characteristics of unit cells formed at a surface of one semiconductor wafer may be suppressed.

Further, according to the first embodiment, by increasing the number of steps (number of times) of the ion implantation at ion implantation processes for forming the p$^{++}$-type contact region, the p-type high-concentration region may be formed; and therefore, is substantially equivalent to no changes in the number of processes and sequence of processes in the method of manufacturing the conventional silicon carbide semiconductor device (refer to FIG. 14) that does not include a HALO region. Design changes of the production line, etc. are not necessary and compared to a case in which the p-type high-concentration region is formed by oblique ion implantation to the trench side wall, the process lead time may be shortened. Therefore, the p-type high-concentration region of the p-type base region may be formed efficiently.

Figure 9:
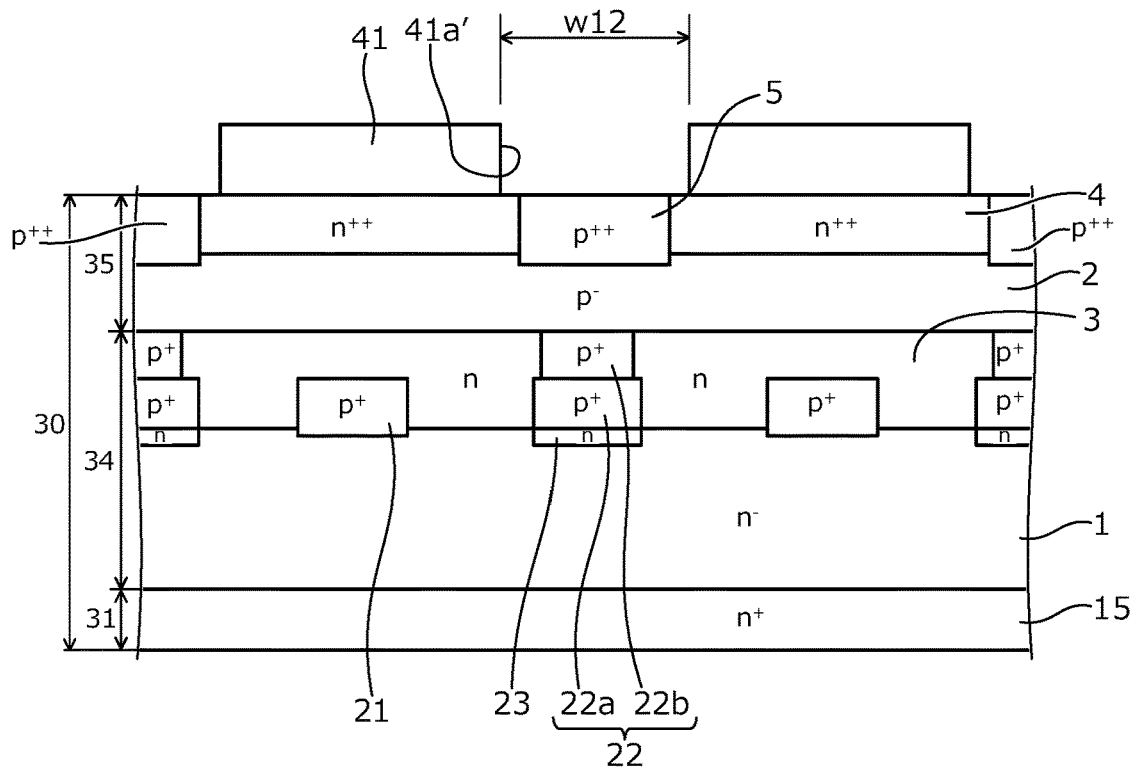
FIG. 9 is a cross-sectional view of the silicon carbide semiconductor device according to a second embodiment during manufacture.
Figure 10:
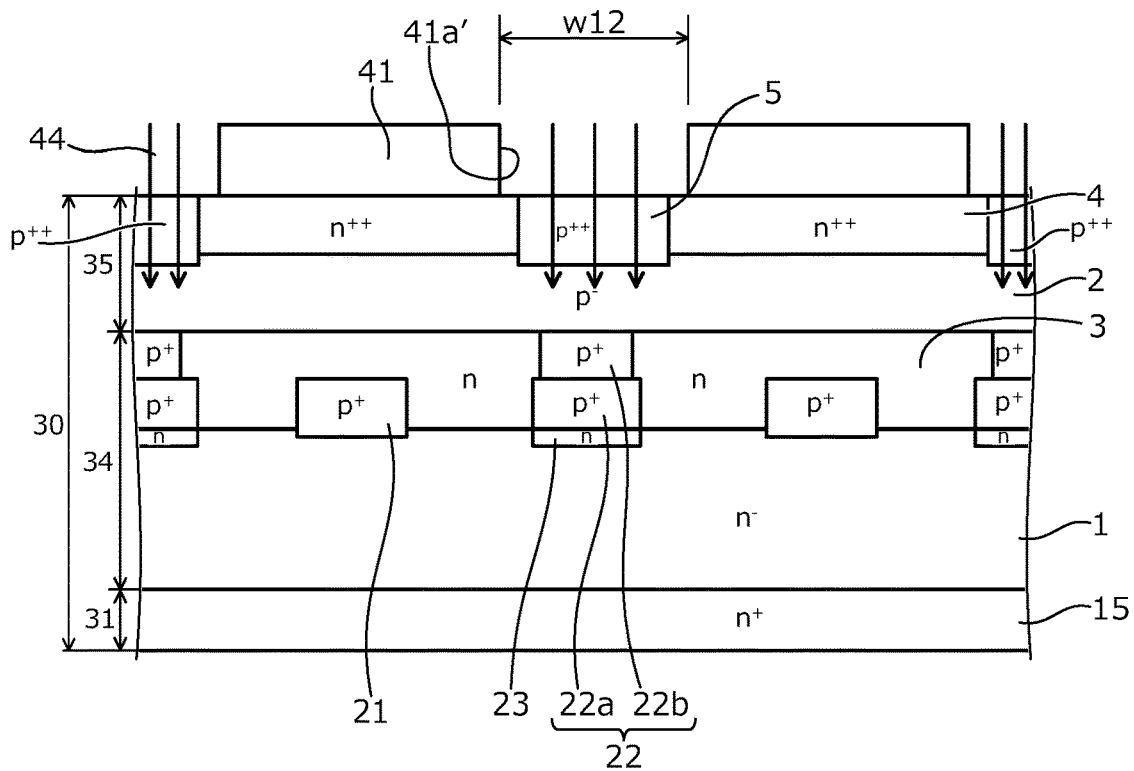
FIG. 10 is a cross-sectional view of the silicon carbide semiconductor device according to the second embodiment during manufacture.

A method of manufacturing the silicon carbide semiconductor device according to a second embodiment will be described with reference to FIGS. 4 to 6, and 8 to 10. FIGS. 9 and 10 are cross-sectional views of the silicon carbide semiconductor device according to the second embodiment during manufacture. The method of manufacturing the silicon carbide semiconductor device according to the second embodiment applies the method of manufacturing the silicon carbide semiconductor device 10 according to the first embodiment and is a method of manufacturing a silicon carbide semiconductor device in which the separation distance Tch (refer to FIG. 1) of the first portion 2c of the p-type high-concentration region 2b from the side wall of the trench 6 is made shorter.

In the method of manufacturing the silicon carbide semiconductor device according to the second embodiment, first, similarly to the first embodiment, processes at steps S1 to S4 are sequentially performed (refer to FIGS. 4 and 5). Next, similarly to the first embodiment, the ion implantation mask 41 having the openings 41a at portions corresponding to formation regions of the p$^{++}$-type contact region 5 is formed, and the ion implantation 42 of a p-type impurity is performed using the ion implantation mask 41 as a mask, whereby the p$^{++}$-type contact region 5 is selectively formed (refer to FIG. 6).

Next, as depicted in FIG. 9, by photolithography and etching, a width w12 of openings 41a' of the ion implantation mask 41 is increased. Next, as depicted in FIG. 10, using, as a mask, the ion implantation mask 41 having the openings 41a' of a width w12 made wider than at the time of formation of the p$^{++}$-type contact region 5, a p-type impurity is ion implanted from a direction substantially orthogonal to the front surface of the semiconductor substrate 30 (second ion implantation) 44, and the p-type high-concentration region 2b is selectively formed in the p$^-$-type silicon carbide epitaxial layer 35 (step S5).

Conditions of the ion implantation 44, for example, are the same conditions of the ion implantation 43 in the first embodiment. By the ion implantation 44, similarly to the first embodiment, the p-type high-concentration region 2b of the p-type base region 2 is formed directly beneath the p$^{++}$-type contact region 5. Further, the p-type impurity ion-implanted by the ion implantation 44 diffuses in the horizontal direction about 0.2 μm from ends of the openings 41a' that are in the ion implantation mask 41 and have the widened width w12.

In the second embodiment, as described above, the ion implantation mask 41 in which the width w12 of the openings 41a' is wider than that during the ion implantation 42 for forming the p$^{++}$-type contact region 5 is used during the ion implantation 44 for forming the p-type high-concentration region 2b. As a result, the width w2 of the p-type high-concentration region 2b becomes wider than when the p-type high-concentration region 2b is formed in the first embodiment and therefore, the separation distance Tch of the first portion 2c of the p-type high-concentration region 2b from the side wall of the trench 6 may be made shorter.

Instead of the ion implantation mask 41, an ion implantation mask having openings of the width w12 may be newly formed and the ion implantation 44 may be performed using the newly formed ion implantation mask as a mask. Thereafter, similarly to the first embodiment, the processes at steps S6 to S10 are sequentially performed (refer to FIG. 4), whereby silicon carbide semiconductor device is completed in which the separation distance Tch of the first portion 2c of the p-type high-concentration region 2b from the side wall of the trench 6 is further shortened.

As described above, according to the second embodiment, effects similar to those of the first embodiment may be obtained. Further, according to the second embodiment, opening widths of the ion implantation mask used in the ion implantation for forming the p-type high-concentration region are widened, thereby enabling the separation distance of the first portion of the p-type high-concentration region to be further shortened.

Figure 11:
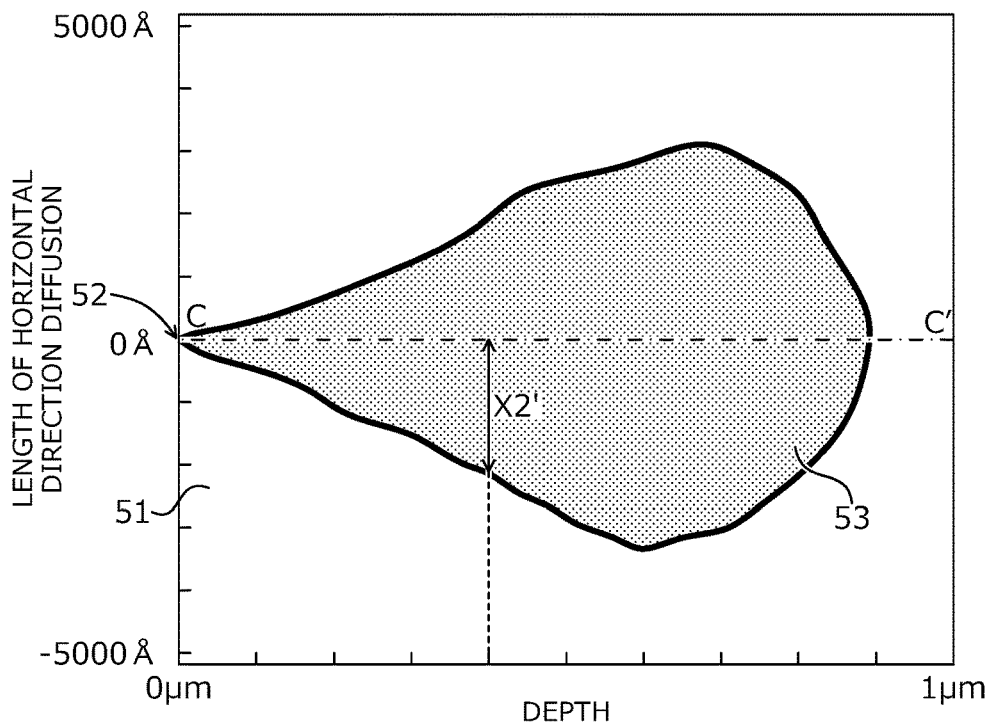
FIG. 11 is a characteristics diagram schematically depicting distribution of an impurity ion-implanted in a silicon carbide epitaxial layer.

In a first example, the horizontal direction diffusion of a p-type impurity ion-implanted into a silicon carbide epitaxial layer was verified. FIG. 11 is a characteristics diagram schematically depicting distribution of an impurity ion-implanted in a silicon carbide epitaxial layer. FIG. 11 depicts results of simulation of the diffusion of a p-type impurity ion-implanted from a predetermined point (1 point) 52 of a surface (ion implantation surface) of a silicon carbide epitaxial layer 51. In FIG. 11, a range 53 in which much of the p-type impurity is present is indicated by hatching and p-type impurity diffusion to positions outside the range 53 is not depicted. The diffusion of the p-type impurity may be estimated by a scanning capacitance microscope, a scanning nonlinear dielectric microscope, a scanning microwave microscope, or the like.

In FIG. 11, a horizontal axis is a depth [Å] from the ion implantation surface of the silicon carbide epitaxial layer 51. In FIG. 11, a vertical axis is a length of the horizontal direction diffusion of the p-type impurity in a direction (the horizontal direction) parallel to the ion implantation surface, from the predetermined point 52 (=0 [Å]) of the ion implantation surface of the silicon carbide epitaxial layer 51. Cutting line C-C' passes through the predetermined point 52 of the ion implantation surface of the silicon carbide epitaxial layer 51, and is a cutting line orthogonal to the ion implantation surface. Conditions of the ion implantation of the p-type impurity to the silicon carbide epitaxial layer 51 were bivalent aluminum ($Al^{2+}$) as the dopant and the acceleration energy therefore was set to, for example, 700 keV.

From the results depicted in FIG. 11, it was confirmed that the p-type impurity ion-implanted from the predetermined point 52 of the ion implantation surface of the silicon carbide epitaxial layer 51 spreads, diffusing in the vertical direction from the ion implantation surface of the silicon carbide epitaxial layer 51 and diffusing the horizontal direction, substantially symmetrically centered around the predetermined point 52. Further, it was confirmed that a length x2' of the horizontal direction diffusion at a depth position at about 0.4 μm from the ion implantation surface of the silicon carbide epitaxial layer 51 is about 0.2 μm.

Figure 12:
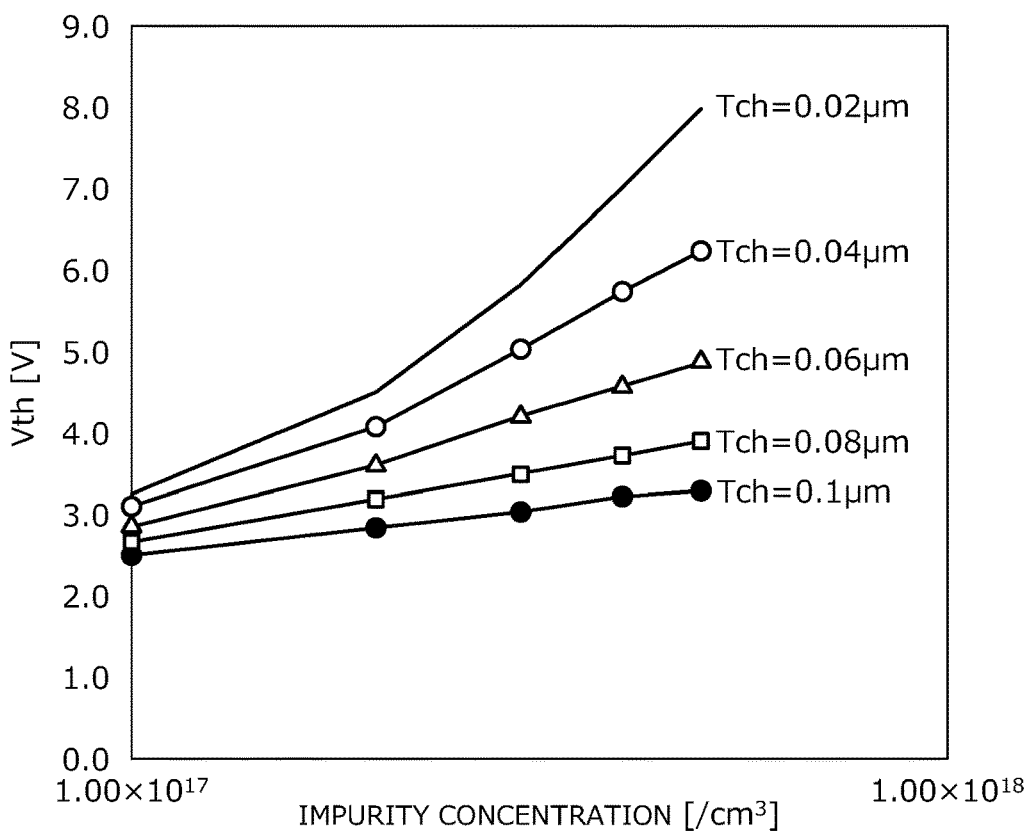
FIG. 12 is a characteristics diagram depicting a relationship between peak concentration of a first portion of a p-type high-concentration region and separation distance in a second example.
Figure 13:
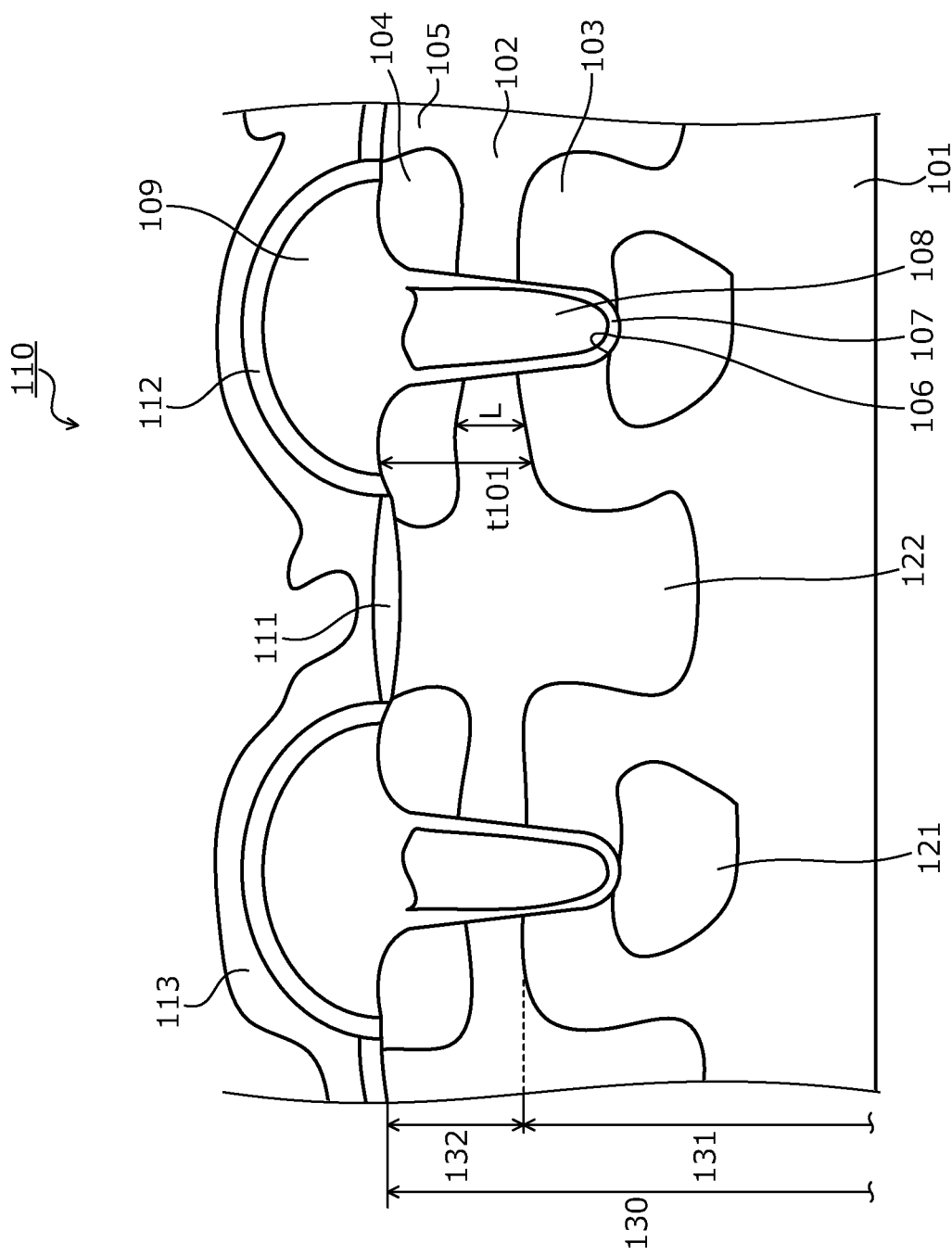
FIG. 13 is a cross-sectional view of a structure of a conventional silicon carbide semiconductor device.

Next, a relationship between the peak concentration of the first portion 2c of the p-type high-concentration region 2b and the separation distance Tch of the first portion 2c of the p-type high-concentration region 2b from the side wall of the trench 6 was verified. FIG. 12 is a characteristics diagram depicting a relationship between peak concentration of a first portion of a p-type high-concentration region and separation distance in a second example. In FIG. 12, a horizontal axis is the peak concentration of the first portion of the p-type high-concentration region and a vertical axis is a gate threshold voltage Vth of the silicon carbide semiconductor device 10 according to the first embodiment described above. Voltage between the drain and source applied in the silicon carbide semiconductor device 10 was set to 20V.

From the results depicted in FIG. 12, it was confirmed that when the separation distance Tch is wider than 0.1 μm, independent of the peak concentration of the first portion 2c of the p-type high-concentration region 2b, the gate threshold voltage Vth does not vary easily. Further, it was confirmed that the narrower the separation distance Tch is set, the higher the gate threshold voltage Vth may be set. Therefore, the present invention is useful when the separation distance Tch is 0.1 μm or less. Further, it was confirmed that the higher the peak concentration of the first portion of the p-type high-concentration region is set, the higher the gate threshold voltage Vth may be set.

In the foregoing, the present invention is not limited to the embodiments described above and various modifications within a range not departing from the spirit of the invention are possible. For example, the ion implantation conditions for forming the $p^{++}$-type contact region and the p-type high-concentration region described above are one example and may be variously set according to specifications.

According to the described embodiments of the present invention, the p-type high-concentration region functions as a HALO region and therefore, increases in the short channel effects are suppressed and gate threshold voltage decreases are suppressed, thereby enabling both high gate threshold voltage and low ON resistance to be achieve, as well as suppression of leak current during the OFF state. Further, according to the described embodiments of the invention, in forming the p-type high-concentration region that becomes the HALO region, oblique ion implantation to the trench side wall like that used conventionally is not used and therefore, the p-type high-concentration region may be formed efficiently and with dimensional accuracy.

The silicon carbide semiconductor device and the method of manufacturing a silicon carbide semiconductor device according to the present invention achieve an effect in that a base region having a high-concentration region at a portion separated from the trench side wall may be formed efficiently and with dimensional accuracy.

As described, the silicon carbide semiconductor device and the method of manufacturing a silicon carbide semiconductor device is useful for power semiconductor devices used in power converting equipment and power supply devices such as in industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
  a semiconductor substrate containing silicon carbide, and having a front surface and a rear surface opposite to the front surface, the semiconductor substrate including
    a first semiconductor layer of a first conductivity type, having an upper surface and a lower surface, and
    a second semiconductor layer provided on the upper surface of the first semiconductor layer, and having an upper surface forming the front surface of the semiconductor substrate, and a lower surface facing the upper surface of the first semiconductor layer;
  a first semiconductor region of the first conductivity type, selectively provided at the upper surface of the second semiconductor layer;
  a second semiconductor region of a second conductivity type, selectively provided at the upper surface of the second semiconductor layer;
  a third semiconductor region of the second conductivity type, having an impurity concentration lower than an impurity concentration of the second semiconductor region, the third semiconductor region being a portion of the second semiconductor layer excluding the first semiconductor region and the second semiconductor region, the third semiconductor region including
    a high-impurity-concentration region of the second conductivity type, facing the second semiconductor region in a depth direction, and
    a low-impurity-concentration region of the second conductivity type, facing the high-impurity-concentration region in a direction parallel to the front surface of the semiconductor substrate, the low-impurity-concentration region having an upper surface facing the first semiconductor region and a lower surface facing the upper surface of the first semiconductor layer in the depth direction, the low-impurity-concentration region being a portion of the third semiconductor region excluding the high-impurity-concentration region;

a trench penetrating the first semiconductor region and the low-impurity-concentration region from the front surface of the semiconductor substrate, and reaching the first semiconductor layer;

a gate insulating film provided on an inner surface of the trench;

a gate electrode provided in the trench, via the gate insulating film;

a first electrode electrically connected to the first semiconductor region and the second semiconductor region; and a second electrode provided at the rear surface of the semiconductor substrate, wherein the impurity concentration in the high-impurity-concentration region decreases toward the low-impurity-concentration region in a direction parallel to the front surface of the semiconductor substrate.

2. The silicon carbide semiconductor device according to claim 1, wherein a width of the high-impurity-concentration region in the direction parallel to the front surface of the semiconductor substrate is greater than a width of the second semiconductor region.

3. The silicon carbide semiconductor device according to claim 1, wherein the high-impurity-concentration region has a one part that faces the first semiconductor region and an other part that faces the second semiconductor region in the depth direction, the impurity concentration in the high-impurity-concentration region decreases toward the front surface of the semiconductor substrate in the depth direction, and decreases toward the rear surface of the semiconductor substrate in the depth direction, and the first semiconductor region has an upper surface forming the front surface of the semiconductor substrate and a lower surface facing the high-impurity-concentration region, and a point of the high-impurity-concentration region having a greatest impurity concentration is located at a position separated from the lower surface of first semiconductor region in the depth direction.

4. The silicon carbide semiconductor device according to claim 1, wherein a distance between the high-impurity-concentration region and an outer surface of the trench in the direction parallel to the front surface of the semiconductor substrate is in a range of 0.04 µm to 0.2 µm.

5. The silicon carbide semiconductor device according to claim 4, wherein the distance between the high-impurity-concentration region and the outer surface of the trench is in a range of 0.06 µm to 0.1 µm.

6. A silicon carbide semiconductor device, comprising:
a semiconductor substrate containing silicon carbide, and having a front surface and a rear surface opposite to the front surface, the semiconductor substrate including
a first semiconductor layer of a first conductivity type, having an upper surface and a lower surface, and
a second semiconductor layer provided on the upper surface of the first semiconductor layer, and having an upper surface forming the front surface of the semiconductor substrate, and a lower surface facing the upper surface of the first semiconductor layer;

a first semiconductor region of the first conductivity type, selectively provided at the upper surface of the second semiconductor layer;

a second semiconductor region of a second conductivity type, selectively provided at the upper surface of the second semiconductor layer;

a third semiconductor region of the second conductivity type, having an impurity concentration lower than an impurity concentration of the second semiconductor region, the third semiconductor region being a portion of the second semiconductor layer excluding the first semiconductor region and the second semiconductor region, the third semiconductor region including
a high-impurity-concentration region of the second conductivity type, facing the second semiconductor region in a depth direction, and
at least one low-impurity-concentration region of the second conductivity type, facing the high-impurity-concentration region in a direction parallel to the front surface of the semiconductor substrate, the at least one low-impurity-concentration region having an upper surface facing the first semiconductor region and a lower surface facing the upper surface of the first semiconductor layer in the depth direction, the at least one low-impurity-concentration region being a portion of the third semiconductor region excluding the high-impurity-concentration region;

a trench penetrating the first semiconductor region and the at least one low-impurity-concentration region from the front surface of the semiconductor substrate, and reaching the first semiconductor layer;

a gate insulating film provided on an inner surface of the trench;

a gate electrode provided in the trench, via the gate insulating film;

a first electrode electrically connected to the first semiconductor region and the second semiconductor region; and a second electrode provided at the rear surface of the semiconductor substrate, wherein the impurity concentration in the high-impurity-concentration region decreases toward a closest one of the at least one low-impurity-concentration region in a direction parallel to the front surface of the semiconductor substrate.

* * * * *